US012596284B2

(12) United States Patent
Park et al.

(10) Patent No.: US 12,596,284 B2
(45) Date of Patent: Apr. 7, 2026

(54) OPTICAL PATH CONTROL MEMBER AND DISPLAY DEVICE COMPRISING SAME

(71) Applicant: LG INNOTEK CO., LTD., Seoul (KR)

(72) Inventors: Jin Gyeong Park, Seoul (KR); Jong Sik Lee, Seoul (KR); Byung Sook Kim, Seoul (KR); Hyung Woo Yang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 425 days.

(21) Appl. No.: 18/007,139

(22) PCT Filed: Jul. 23, 2021

(86) PCT No.: PCT/KR2021/009522
§ 371 (c)(1),
(2) Date: Jan. 27, 2023

(87) PCT Pub. No.: WO2022/025529
PCT Pub. Date: Feb. 3, 2022

(65) Prior Publication Data
US 2023/0229035 A1      Jul. 20, 2023

(30) Foreign Application Priority Data

Jul. 28, 2020      (KR) ........................ 10-2020-0093728
Jul. 28, 2020      (KR) ........................ 10-2020-0093833

(51) Int. Cl.
*G02F 1/1676*      (2019.01)
*G02F 1/1335*      (2006.01)
(Continued)

(52) U.S. Cl.
CPC .......... *G02F 1/1676* (2019.01); *G02F 1/1335* (2013.01); *G02F 1/1677* (2019.01);
(Continued)

(58) Field of Classification Search
CPC .................. G02B 26/023; G02B 26/08; G02B 2207/123; G02F 1/1323; G02F 1/167;
(Continued)

(56) References Cited

U.S. PATENT DOCUMENTS

| | | | |
|---|---|---|---|
| 12,092,937 B2 | 9/2024 | Kim et al. | |
| 2009/0237775 A1 | 9/2009 | Ito et al. | |

(Continued)

FOREIGN PATENT DOCUMENTS

| | | |
|---|---|---|
| CN | 106462025 A | 2/2017 |
| JP | 2009-229689 A | 10/2009 |

(Continued)

OTHER PUBLICATIONS

International Search Report dated Oct. 29, 2021 in International Application No. PCT/KR2021/009522.

(Continued)

*Primary Examiner* — Jia X Pan
(74) *Attorney, Agent, or Firm* — SALIWANCHIK, LLOYD & EISENSCHENK

(57) ABSTRACT

An optical path control member, according to an embodiment, comprises: a first substrate by which a first direction and a second direction are defined; a first electrode disposed on the first substrate; a second substrate disposed on the first substrate and by which the first direction and the second direction are defined; a second electrode disposed under the second substrate; and an optical conversion unit disposed between the first electrode and the second electrode, wherein the second substrate and the second electrode include a cutting part penetrating the second substrate and the second electrode, the cutting part includes: a 1-1 cutting part and a 1-3 cutting part disposed to face each other in the second direction; a 1-2 cutting part disposed adjacent to the 1-1 cutting part and spaced apart from the 1-1 cutting part; and (Continued)

a 1-4 cutting part disposed adjacent to the 1-3 cutting part and spaced apart from the 1-3 cutting part, a 1-1 sealing part and a 1-3 sealing part are respectively disposed in the 1-1 cutting part and the 1-3 cutting part, and a 1-2 sealing part and a 1-4 sealing part are respectively disposed inside the 1-2 cutting part and the 1-4 cutting part.

15 Claims, 23 Drawing Sheets

(51) Int. Cl.

| | |
|---|---|
| *G02F 1/1677* | (2019.01) |
| *G02F 1/1679* | (2019.01) |
| *H10K 59/80* | (2023.01) |
| *H10K 77/00* | (2023.01) |

(52) U.S. Cl.
CPC .......... *G02F 1/1679* (2019.01); *H10K 77/00* (2023.02); *H10K 59/8722* (2023.02); *H10K 59/8792* (2023.02)

(58) Field of Classification Search
CPC .... G02F 1/1679; G02F 1/1681; G02F 1/1676; G02F 1/1677; H10K 59/50; H10K 59/8791; H10K 59/8722; H10K 59/8792
See application file for complete search history.

(56) References Cited

U.S. PATENT DOCUMENTS

2012/0092754 A1 * 4/2012 Yu ........................... G02F 1/167
156/146

2017/0010516 A1 * 1/2017 Shiota ............... G02F 1/133512
2021/0373403 A1 12/2021 Kim et al.

FOREIGN PATENT DOCUMENTS

| JP | 2009-288499 A | | 12/2009 | |
|---|---|---|---|---|
| JP | 2010-85566 A | | 4/2010 | |
| JP | 2010085566 A | * | 4/2010 | |
| JP | 2013037190 A | * | 2/2013 | |
| KR | 10-2012-0034517 A | | 4/2012 | |
| KR | 10-2012-0070937 A | | 7/2012 | |
| KR | 10-1311889 B1 | | 9/2013 | |
| KR | 10-2018-0004879 A | | 1/2018 | |
| KR | 10-2018-0065207 A | | 6/2018 | |
| KR | 10-2020-0008639 A | | 1/2020 | |
| KR | 10-2020-0028078 A | | 3/2020 | |
| WO | 2015/122083 A1 | | 8/2015 | |
| WO | WO-2020050582 A1 | * | 3/2020 | ............. G02F 1/166 |

OTHER PUBLICATIONS

Office Action dated Jan. 2, 2025 in Korean Application No. 10-2020-0093728.

Office Action dated Jul. 18, 2024 in Korean Application No. 10-2020-0093833.

Office Action dated Dec. 23, 2025 in Chinese Application No. 202180065212.6.

* cited by examiner

Fig. 23

LIGHT

LIGHT BLOCKING MODE

OPTICAL PATH CONTROL MEMBER AND DISPLAY DEVICE COMPRISING SAME

CROSS-REFERENCE TO RELATED APPLICATIONS

This application is the U.S. national stage application of International Patent Application No. PCT/KR2021/009522, filed Jul. 23, 2021, which claims the benefit under 35 U.S.C. § 119 of Korean Application Nos. 10-2020-0093728, filed Jul. 28, 2020; and 10-2020-0093833, filed Jul. 28, 2020; the disclosures of each of which are incorporated herein by reference in their entirety.

TECHNICAL FIELD

An embodiment relates to an optical path control member, and to a display device including the same.

BACKGROUND ART

A light blocking film blocks transmitting of light from a light source, and is attached to a front surface of a display panel which is a display device used for a mobile phone, a notebook, a tablet PC, a vehicle navigation device, a vehicle touch, etc., so that the light blocking film adjusts a viewing angle of light according to an incident angle of light to express a clear image quality at a viewing angle needed by a user when the display transmits a screen.

In addition, the light blocking film may be used for the window of a vehicle, building or the like to shield outside light partially to inhibit glare, or to inhibit the inside from being visible from the outside.

That is, the light blocking film may be an optical path control member that controls the movement path of light to block light in a specific direction and transmit light in a specific direction. Accordingly, it is possible to control the viewing angle of the user by controlling a transmission angle of the light by the light blocking film.

Meanwhile, such a light blocking film may be divided into a light blocking film that can always control the viewing angle regardless of the surrounding environment or the user's environment and a switchable light blocking film that allow the user to turn on/off the viewing angle control according to the surrounding environment or the user's environment.

Such a switchable light blocking film may be implemented by converting a pattern part into a light transmitting part and a light blocking part by filling the inside of the pattern part with particles that may move when a voltage is applied and a dispersion liquid for dispersing the particles and by dispersing and aggregating the particles.

That is, the switchable light blocking film may include a plurality of patterns filled with a dispersion liquid to change the path of light.

As described above, these patterns are formed by filling the viscous dispersion. Accordingly, there is a problem in that driving characteristics and reliability of the switchable light blocking film are reduced because the dispersion liquid leaks out or impurities penetrate into the dispersion liquid during use of the switchable light blocking film.

In addition, when the switchable light blocking film is combined with a display panel and used as a display device, the patterns of the switchable light blocking film overlap with a pattern of the display panel, so that a moire phenomenon may occur. Accordingly, when a user uses the display device, there is a problem in that visibility is reduced due to moire.

Accordingly, the optical path control member having a new structure capable of solving the above problems is required.

DISCLOSURE

Technical Problem

An embodiment relates to an optical path control member having improved visibility and reliability, and to a display device including the same.

Technical Solution

An optical path control member according to an embodiment includes: a first substrate on which a first direction and a second direction are defined; a first electrode disposed on the first substrate; a second substrate disposed on the first substrate and defining the first direction and the second direction; a second electrode disposed under the second substrate; and a light conversion unit disposed between the first electrode and the second electrode, wherein the second substrate and the second electrode include a cutting part penetrating the second substrate and the second electrode, wherein the cutting part comprising; a 1-1 cutting part and a 1-3 cutting part disposed facing each other in the second direction; a 1-2 cutting part adjacent to the 1-1 cutting part and spaced apart from the 1-1 cutting part; and a 1-4 cutting part adjacent to the 1-3 cutting part and spaced apart from the 1-3 cutting part, wherein a 1-1 sealing part and a 1-3 sealing part are respectively disposed on the 1-1 cutting part and the 1-3 cutting part, and wherein a 1-2 sealing part and a 1-4 sealing part are disposed inside the 1-2 cutting part and the 1-4 cutting part, respectively.

Advantageous Effects

In the optical path control member according to the embodiment, a 1-1 cutting part, a 1-2 cutting part, a 1-3 cutting part, and a 1-4 cutting part may be formed on the second substrate, and the 1-1 cutting part, the 1-2 cutting part, the 1-3 cutting part, and the 1-4 cutting part penetrate the second substrate, a second electrode, a buffer layer, and penetrate all or part of a light conversion part.

In addition, inside the 1-1 cutting part, the 1-2 cutting part, the 1-3 cutting part, and the 1-4 cutting part, respectively, a 1-1 sealing part, a 1-2 sealing part, A 1-3 sealing part and a 1-4 sealing part may be disposed.

The 1-1 sealing part and the 1-3 sealing part disposed inside the 1-1 cutting part and the 1-3 cutting part may seal the accommodating part of the light conversion part. That is, the 1-1 sealing part may inhibit the light conversion material accommodated in the accommodating part from leaking out, and impurity that may permeate from the outside may be inhibited from penetrating into the light conversion part.

In addition, the 1-2 sealing parts and the 1-4 sealing parts disposed inside the 1-2 cutting parts and the 1-4 cutting parts may inhibit the light conversion material from leaking during a process of injecting the light conversion material into the accommodating part.

Accordingly, since the optical path control member according to the embodiment includes the 1-1 and 1-3 sealing parts for sealing the light conversion material, and the 1-2 and 1-4 sealing parts for blocking the movement of the light conversion material, visibility and reliability of the optical path control member can be improved.

DESCRIPTION OF DRAWINGS

FIG. 23 is a cross-sectional view taken along the line J-J' of FIG. 22.

MODES OF THE INVENTION

Figure 1:
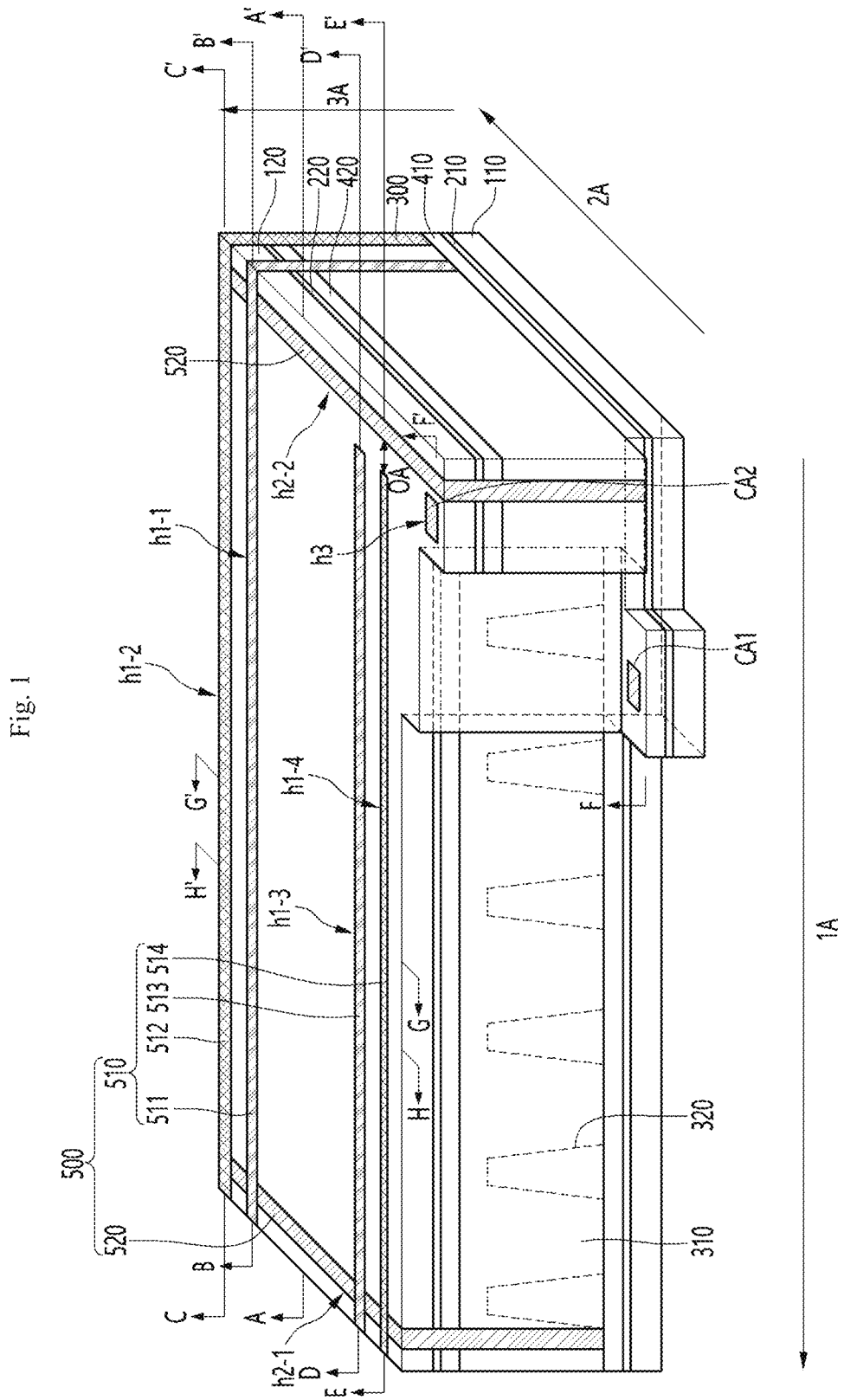
FIG. 1 is a perspective view of an optical path control member according to a first embodiment.

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms) may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence, order, or order of the elements.

In addition, when an element is described as being "connected", or "coupled" to another element, it may include not only when the element is directly "connected" to, or "coupled" to other elements, but also when the element is "connected", or "coupled" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, an optical path control member according to an embodiment will be described with reference to drawings. The optical path control member described below relates to a switchable optical path control member driven in various modes according to electrophoretic particles moving by application of a voltage.

Hereinafter, the optical path control member according to the first embodiment will be described with reference to FIGS. 1 to 13.

Referring to FIGS. 1 to 13, the optical path control member according to a first embodiment includes a first substrate 110, a second substrate 120, a first electrode 210, a second electrode 220, and a light conversion unit 300.

The first substrate 110 may support the first electrode 210. The first substrate 110 may be rigid or flexible.

Also, the first substrate 110 may be transparent. For example, the first substrate 110 may include a transparent substrate capable of transmitting light.

The first substrate 110 may include glass, plastic, or a flexible polymer film. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS), which is only an example, but the embodiment is not limited thereto.

In addition, the first substrate 110 may be a flexible substrate having flexible characteristics.

Also, the first substrate 110 may be a curved or bent substrate. That is, the optical path control member including the first substrate 110 may also be formed to have a flexible, curved or bended characteristic. For this reason, the optical path control member according to the embodiment may be changed into various designs.

The first substrate 110 may extend in a first direction 1A, a second direction 2A, and a third direction 3A.

In detail, the first substrate 110 has a first direction 1A corresponding to the length or width direction of the first substrate 110, a second direction 2A extending in a direction different from the first direction 1A and corresponding to the length or width direction of the first substrate 110, and a third direction 3A extending in a direction different from the first and second directions and corresponding to the thickness direction of the first substrate 110.

For example, the first direction 1A may be defined as a length direction of the first substrate 110, the second direction 2A may be defined as a width direction of the first substrate 110 perpendicular to the first direction 1A, and the third direction 3A may be defined in the thickness direction of the first substrate 110. Alternatively, the first direction 1A may be defined as a width direction of the first substrate 110, the second direction 2A may be defined as a length direction of the first substrate 110 perpendicular to the first direction 1A, and the third direction 3A may be defined in the thickness direction of the first substrate 110.

Hereinafter, for convenience of explanation, the first direction 1A is described as the length direction of the first substrate 110, the second direction 2A is described as the width direction of the first substrate 110, and the third direction 3A is described as the thickness direction of the first substrate 110.

The first electrode 210 may be disposed on one surface of the first substrate 110. In detail, the first electrode 210 may be disposed on the upper surface of the first substrate 110. That is, the first electrode 210 may be disposed between the first substrate 110 and the second substrate 120.

The first electrode 210 may include a transparent conductive material. For example, the first electrode 210 may include a conductive material having a light transmittance of about 80% or more. For example, the first electrode 210 may include a metal oxide such as indium tin oxide, indium zinc oxide, copper oxide, tin oxide, zinc oxide, titanium oxide, etc.

The first electrode 210 may have a thickness of about 10 nm to about 300 nm.

Alternatively, the first electrode 210 may include various metals to realize low resistance. For example, the first electrode 210 may include at least one metal of chromium (Cr), nickel (Ni), copper (Cu), aluminum (Al), silver (Ag), molybdenum (Mo), gold (Au), titanium (Ti), and alloys thereof.

The first electrode 210 may be disposed on the entire surface of one surface of the first substrate 110. In detail, the first electrode 210 may be disposed as a surface electrode on one surface of the first substrate 110. However, the embodiment is not limited thereto, and the first electrode 210 may be formed of a plurality of patterned electrodes having a certain pattern such as a mesh or stripe shape.

For example, the first electrode 210 may include a plurality of conductive patterns. In detail, the first electrode 210 may include a plurality of mesh lines crossing each other and a plurality of mesh openings formed by the mesh lines.

Accordingly, even if the first electrode 210 includes metal, since the first electrode 210 is not visually recognized from the outside, visibility may be improved. Also, since light transmittance is increased by the openings, luminance of the optical path control member according to the embodiment may be improved.

The second substrate 120 may be disposed on the first substrate 110. In detail, the second substrate 120 may be disposed on the first electrode 210 on the first substrate 110.

The second substrate 120 may include a material capable of transmitting light. The second substrate 120 may include a transparent material. The second substrate 120 may include the same or similar material as the first substrate 110 described above.

For example, the second substrate 120 may include glass, plastic, or a flexible polymer film. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS), which is only an example, but the embodiment is not limited thereto.

In addition, the second substrate 120 may be a flexible substrate having flexible characteristics.

Also, the second substrate 120 may be a curved or bent substrate. That is, the optical path control member including the second substrate 120 substrate 110 may also be formed to have a flexible, curved or bended characteristic. For this reason, the optical path control member according to the embodiment may be changed into various designs.

The second substrate 120 may also extend in the first direction 1A, the second direction 2A, and the third direction 3A like the first substrate 110 described above.

In detail, the second substrate 120 has a first direction 1A corresponding to the length or width direction of the second substrate 120, a second direction 2A extending in a direction different from the first direction 1A and corresponding to the length or width direction of the second substrate 120, and a third direction 3A extending in a direction different from the first and second directions and corresponding to the thickness direction of the second substrate 120.

For example, the first direction 1A may be defined as a length direction of the second substrate 120, the second direction 2A may be defined as a width direction of the second substrate 120 perpendicular to the first direction 1A, and the third direction 3A may be defined in the thickness direction of the second substrate 120. Alternatively, the first direction 1A may be defined as a width direction of the second substrate 120, the second direction 2A may be defined as a length direction of the second substrate 120 perpendicular to the first direction 1A, and the third direction 3A may be defined in the thickness direction of the second substrate 120.

Hereinafter, for convenience of explanation, the first direction 1A is described as the length direction of the second substrate 120, the second direction 2A is described as the width direction of the second substrate 120, and the third direction 3A is described as the thickness direction of the second substrate 120.

The second electrode 220 may be disposed on one surface of the second substrate 120. In detail, the second electrode 220 may be disposed on the lower surface of the second substrate 120. That is, the second electrode 220 may be disposed on the surface of the second substrate 120 on which the second substrate 120 and the first substrate 110 face each other. That is, the second electrode 220 may be disposed facing the first electrode 210 on the first substrate 110. That is, the second electrode 220 may be disposed between the first electrode 210 and the second substrate 120.

The second electrode 220 may include a material identical to or similar to that of the first electrode 210 described above.

The second electrode 220 may include a transparent conductive material. For example, the second electrode 220 may include a conductive material having a light transmittance of about 80% or more. For example, the second electrode 220 may include a metal oxide such as indium tin oxide, indium zinc oxide, copper oxide, tin oxide, zinc oxide, titanium oxide, etc.

The second electrode 220 may have a thickness of about 10 nm to about 300 nm.

Alternatively, the second electrode 220 may include various metals to realize low resistance. For example, the second electrode 220 may include at least one metal of chromium (Cr), nickel (Ni), copper (Cu), aluminum (Al), silver (Ag), molybdenum (Mo), gold (Au), titanium (Ti), and alloys thereof.

The second electrode 220 may be disposed on the entire surface of one surface of the second substrate 120. However, the embodiment is not limited thereto, and the second electrode 220 may be formed of a plurality of patterned electrodes having a certain pattern such as a mesh or stripe shape.

For example, the second electrode 220 may include a plurality of conductive patterns. In detail, the second electrode 220 may include a plurality of mesh lines crossing each other and a plurality of mesh openings formed by the mesh lines.

Accordingly, even if the second electrode 220 includes metal, since the second electrode 220 is not visually recognized from the outside, visibility may be improved. Also, since light transmittance is increased by the openings, luminance of the optical path control member according to the embodiment may be improved.

A cutting part may be formed on the second substrate 120. In detail, the second substrate 120 may include a plurality of cutting parts.

Referring to FIG. 1, the second substrate may include a 1-1 cutting part h1-1, a 1-2 cutting part h1-2, a 1-3 cutting part h1-3, a 1-4 cutting part h1-4, a 2-1 cutting part h2-1 and a 2-2 cutting part h2-2.

The 1-1 cutting part h1-1, the 1-2 cutting part h1-2, the 1-3 cutting part h1-3, the 1-4 cutting part h1-4, the 2-1 cutting part h2-1 and the 2-2 cutting part h2-2 may be formed in a hole or groove shape.

For example, at least one of the 1-1 cutting part h1-1, the 1-2 cutting part h1-2, the 1-3 cutting part h1-3, the 1-4 cutting part h1-4, the 2-1 cutting part h2-1 and the 2-2 cutting part h2-2 may be formed as a groove, the groove has one end, which is an upper surface of the second substrate, may be open, and the other end, which is a lower surface of the light conversion unit, may be closed. In addition, at least one of the 1-1 cutting part h1-1, the 1-2 cutting part h1-2, the 1-3 cutting part h1-3, the 1-4 cutting part h1-4, the 2-1 cutting part h2-1 and the 2-2 cutting part h2-2 may be formed as a groove, the groove has one end, which is an upper surface of the second substrate, may be open, the other end, which is a lower surface of the light conversion unit, may be open or close, and either side of both sides, which is a direction perpendicular to the longitudinal direction of the cutting part, is open.

In detail, the 1-1 cutting part h1-1, the 1-3 cutting part h1-3, the 1-4 cutting part h1-4, and the 2-1 cutting part h2-1 and the 2-2 cutting part h2-2 may be disposed inside the second substrate 120. Accordingly, the 1-1 cutting part h1-1, the 1-3 cutting part h1-3, the 1-4 cutting part h1-4, and the 2-1 cutting part h2-1 and the 2-2 cutting part h2-2 may be formed as a groove, the groove has one end, which is an upper surface of the second substrate, may be open, and the other end, which is a lower surface of the light conversion unit, may be closed.

Also, the 1-2 cutting parts h1-2 may be disposed on an upper surface and one side surface of the second substrate. Accordingly, the 1-2 cutting parts h1-2 may be formed as a groove, the groove has one end, which is an upper surface of the second substrate, may be open, the other end, which is a lower surface of the light conversion unit, may be close, and one side, which is a direction perpendicular to the longitudinal direction of the cutting part, is open.

The 1-1 cutting part h1-1, the 1-2 cutting part h1-2, the 1-3 cutting part h1-3, and the 1-4 cutting part h1-4, the 2-1 cutting part h2-1 and the 2-2 cutting part h2-2 may extend from the second substrate 120 toward the first substrate 110.

At least one of the 1-1 cutting part h1-1, the 1-2 cutting part h1-2, the 1-3 cutting part h1-3, the 1-4 cutting part h1-4, the 2-1 cutting part h2-1 and the 2-2 cutting part h2-2 may be formed in a shape having a long width and/or short width narrowing while extending from the second substrate 120 toward the first substrate 110.

The 1-1 cutting part h1-1, the 1-2 cutting part h1-2, the 1-3 cutting part h1-3 and the 1-4 cutting part h1-4 may be disposed facing each other. In detail, the 1-1 cutting part h1-1, the 1-2 cutting part h1-2, the 1-3 cutting part h1-3 and the 1-4 cutting part h1-4 extends in the first direction 1A of the second substrate 120, and the 1-1 cutting part h1-1, the 1-2 cutting part h1-2, the 1-3 cutting part h1-3 and the 1-4 cutting part h1-4 may face each other.

That is, the 1-1 cutting part h1-1, the 1-2 cutting part h1-2, the 1-3 cutting part h1-3 and the 1-4 cutting part h1-4 extends in the longitudinal direction of the second substrate 120, the 1-1 cutting part h1-1, and the 1-2 cutting part h1-2, the 1-3 cutting part h1-3 and the 1-4 cutting part h1-4 may face each other.

The 1-1 cutting part h1-1, the 1-2 cutting part h1-2, the 1-3 cutting part h1-3 and the 1-4 cutting part h1-4 may have the same shape and area as each other. Alternatively, the 1-1 cutting part h1-1, the 1-2 cutting part h1-2, the 1-3 cutting part h1-3 and the 1-4 cutting part h1-4 may have different shapes and/or area as each other.

At least one of the 1-1 cutting part h1-1, the 1-2 cutting part h1-2, the 1-3 cutting part h1-3 and the 1-4 cutting part h1-4 may be spaced apart from or contact both ends of the second substrate 120.

The 2-1 cutting part h2-1 and the 2-2 cutting part h2-2 may face each other. In detail, the 2-1 cutting part h2-1 and the 2-2 cutting part h2-2 extend in the second direction 2A of the second substrate 120, and the first cutting part h2-1 and the second cutting part h2-2 may face each other. That is, the 2-1 cutting part h2-1 and the 2-2 cutting part h2-2 extend in the width direction of the second substrate 120, and the 2-1 cutting part h2-1 and the 2-2 cutting part h2-2 may face each other.

The 2-1 cutting part h2-1 and the 2-2 cutting part h2-2 may have the same shape and area. Alternatively, the 2-1 cutting part h2-1 and the 2-2 cutting part h2-2 may have different shapes and/or areas.

At least one cutting part of the 2-1 cutting part h2-1 and the 2-2nd cutting part h2-2 may be spaced apart from or in contact with both ends of the second substrate 120.

Accordingly, the 1-1 cutting part h1-1, the 1-2 cutting part h1-2, the 1-3 cutting part h1-3, and the 1-4 cutting part h1-4, the 2-1 cutting part h2-1 and the 2-2 cutting part h2-2 may extend along the edge of the second substrate 120.

Meanwhile, an open area OA may be formed in the second substrate 120. In detail, the 1-3 cutting part h1-3 and the 1-4 cutting part h1-4 are spaced apart from the 2-2 cutting part h2-2, and the open area OA may be formed in an area between the 1-3 cutting part h1-3 and the 2-2 cutting part h2-2 and an area between the 1-4 cutting part h1-4 and the 2-2 cutting part h2-2.

By the open area OA, current and voltage applied from a electrode connection part 700 of a second connection area CA2 may be transmitted toward an accommodating part 320 of the light conversion unit 300 through the second electrode 220.

The 1-1 cutting part h1-1, the 1-2 cutting part h1-2, the 1-3 cutting part h1-3, and the 1-4 cutting part h1-4, the 2-1 cutting part h2-1 and the 2-2 cutting part h2-2 may be formed through the second substrate 120. In addition, the 1-1 cutting part h1-1, the 1-2 cutting part h1-2, the 1-3 cutting part h1-3, and the 1-4 cutting part h1-4, the 2-1 cutting part (h2-1) and the 2-2 cutting part h2-2 may be formed passing through at least one of the second substrate 120, the light conversion unit 300, and the second electrode 220.

In addition, a sealing material may be disposed inside the 1-1 cutting part h1-1, the 1-2 cutting part h1-2, the 1-3 cutting part h1-3, and the 1-4 cutting part h1-4, the 2-1 cutting part h2-1 and the 2-2 cutting part h2-2. Accordingly, a sealing material may be disposed inside the 1-1 cutting part h1-1, the 1-2 cutting part h1-2, the 1-3 cutting part h1-3, and the 1-4 cutting part h1-4, the 2-1 cutting part h2-1 and the 2-2 cutting part h2-2 to form the sealing part 500.

That is, a first sealing part 510 may be disposed inside the 1-1 cutting part h1-1, the 1-2 cutting part h1-2, the 1-3 cutting part h1-3, and the 1-4 cutting part h1-4, and a second sealing part 520 may be disposed inside the 2-1 cutting part h2-1 and the 2-2 cutting part h2-2.

That is, the first sealing part 510 may include a 1-1 sealing part 511 disposed inside the 1-1 cutting part h1-1, a 1-2 sealing part 512 disposed inside the 1-2 cutting part h1-2, a 1-3 sealing part 513 disposed inside the 1-3 cutting part h1-3, and a 1-4 sealing part 514 disposed inside the 1-4 cutting part h1-4.

The first substrate 110 and the second substrate 120 may have the same or different sizes.

In detail, the first length of the first substrate 110 extending in the first direction 1A may be the same as or similar to the second length of the second substrate 120 extending in the first direction 1A.

For example, the first length and the second length may be 300 mm to 400 mm.

Also, the first width of the first substrate 110 extending in the second direction 2A may be the same as or similar to the second width of the second substrate 120 extending in the second direction.

For example, the first width and the second width may be 150 mm to 200 mm.

Also, the first thickness of the first substrate 110 extending in the third direction 3A may be the same as or similar to the second thickness of the second substrate 120 extending in the third direction.

For example, the first thickness and the second thickness may be 1 mm or less.

Also, the first substrate 110 and the second substrate 120 may have different areas.

Figure 2:
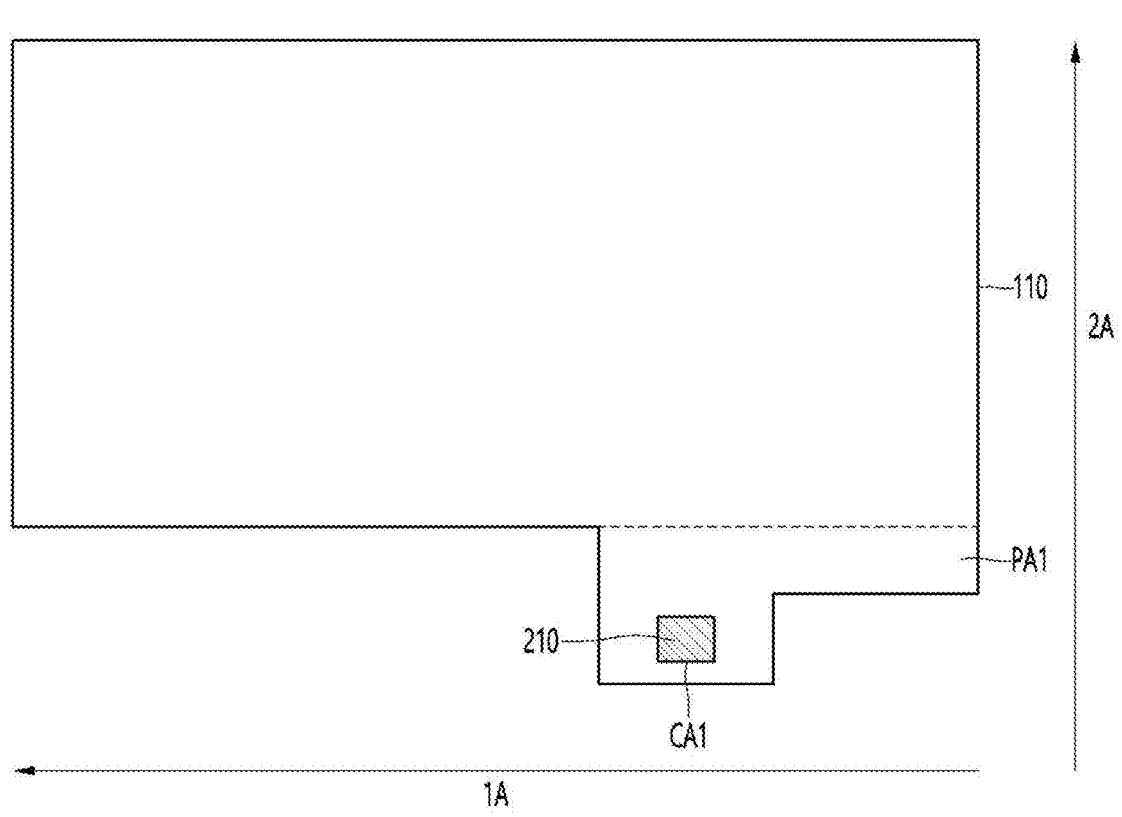
FIG. 2 is a top view of a first substrate of the optical path control member according to the first embodiment.
Figure 3:
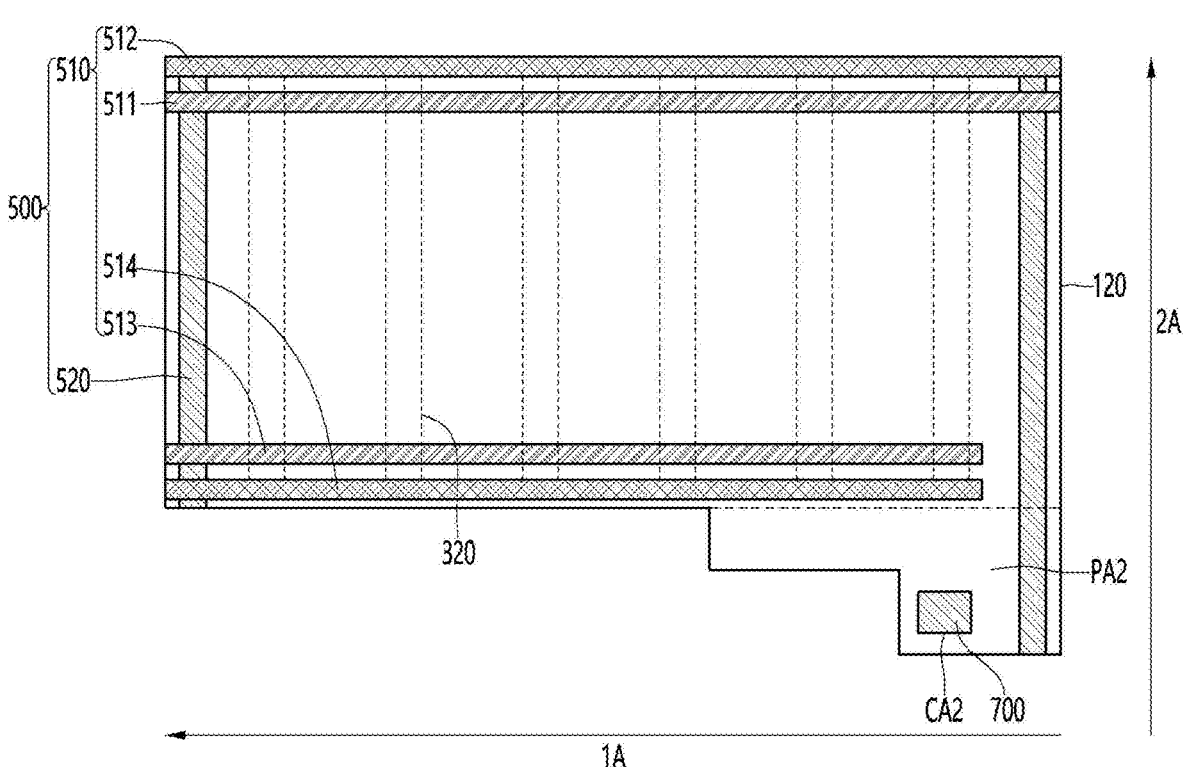
FIG. 3 is a top view of a second substrate of the optical path control member according to the first embodiment

In detail, the first substrate 110 and the second substrate 120 may include protrusions. Referring to FIGS. 2 and 3, the first substrate 110 may include a first protrusion PA1, and the second substrate 120 may include a second protrusion PA2. In detail, the first substrate 110 and the second substrate 120 may each include a first protrusion PA1 and a second protrusion PA2 that do not overlap each other.

That is, the first protrusion PA1 and the second protrusion PA2 do not overlap each other in the third direction 3A.

Alternatively, the embodiment is not limited thereto, and the first protrusion PA1 and the second protrusion PA2 may include an overlapping area overlapping each other and a non-overlapping area not overlapping each other. That is, the first protrusion PA1 and the second protrusion PA2 may include an overlapping area overlapping each other and a non-overlapping area not overlapping each other in the third direction.

In this case, the first protrusion PA1 and the second protrusion PA2 may have different areas. That is, a size difference between the first substrate 110 and the second substrate 120 may be a size difference between the protrusions.

A connection area connected to an external printed circuit board or a flexible printed circuit board may be formed on the first protruding part PA1 of the first substrate 110 and the second protruding part PA2 of the second substrate 120, respectively.

In detail, a first connection area CA1 may be disposed on the first protrusion PA1, and a second connection area CA2 may be disposed on the second protrusion PA2. When the first protrusion PA1 and the second protrusion PA2 are disposed at a position where they do not overlap, the first connection area CA1 and the second connection area CA2 may not overlap in the third direction 3A.

A conductive material is exposed on upper surfaces of the first connection area CA1 and the second connection area CA2, respectively, and the optical path control member may be electrically connected to an external printed circuit board or a flexible printed circuit board by the first connection area CA1 and the second connection area CA2.

For example, a pad part is disposed on the first connection area CA1 and the second connection area CA2, a conductive adhesive containing at least one of an anisotropic conductive film ACF and an anisotropic conductive paste ACP may be disposed between the pad part and the printed circuit board or flexible printed circuit board to connect them.

Alternatively, the conductive adhesive including at least one of an anisotropic conductive film and an anisotropic conductive paste is disposed between the first connection area CA1 and the second connection area CA2 and the printed circuit board or the flexible printed circuit board, and the optical path control member may be directly connected to an external printed circuit board or flexible printed circuit board without the pad part.

The conductive material constituting the first connection area CA1 and the second connection area CA2 will be described in detail below.

The light conversion unit 300 may be disposed between the first substrate 110 and the second substrate 120. In detail, the light conversion unit 300 may be disposed between the first electrode 210 and the second electrode 220.

An adhesive layer or a buffer layer may be disposed in at least one of a region between the light conversion unit 300 and the first substrate 110 or a region between the light conversion unit 300 and the second substrate 120, and the first substrate 110, the second substrate 120, and the light conversion unit 300 may be bonded by the adhesive layer and/or the buffer layer.

For example, an adhesive layer 410 may be disposed between the first electrode 210 and the light conversion unit 300, thereby the first substrate 110 and the light conversion unit 300 may be bonded.

In addition, a buffer layer 420 is disposed between the second electrode 220 and the light conversion unit 300, thereby adhesion between the second electrode 220 and the light conversion unit 300 made of different materials may be improved.

The cutting parts described above may be formed penetrating all or part of the buffer layer 420 and the light conversion part 300. That is, the cutting part penetrates the second substrate 120, the second electrode 220, and the buffer layer 420 in the third direction, and may pass through all or part of the light conversion unit 300.

The light conversion part 300 may include a plurality of barrier rib parts 310 and accommodating parts 320. A light conversion material 330 including light conversion particles that move when voltage is applied and a dispersion liquid for dispersing the light conversion particles may be disposed in the accommodating part 320, and the light transmission characteristics of the optical path control member may be changed by the light conversion particles.

In addition, a sealing part 500 for sealing the light conversion material 330 and a dam part 600 for easily injecting the light conversion material 330 may be disposed in the accommodating part 320.

Figure 4:
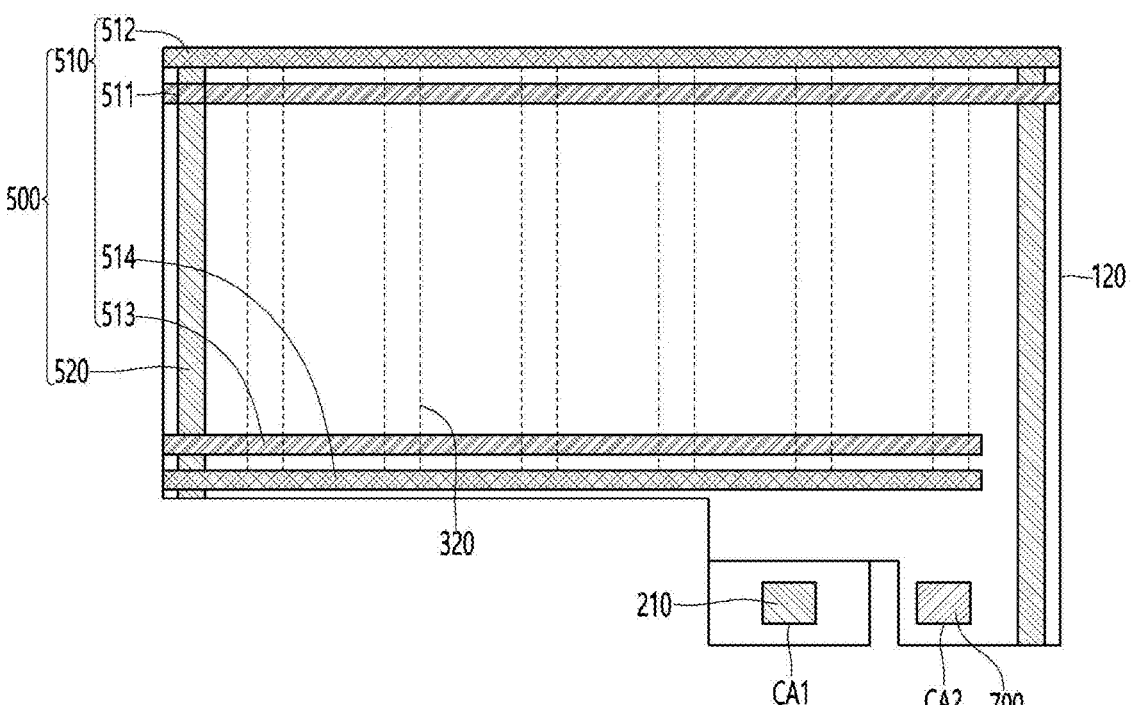
FIG. 4 is a top view of a second substrate in which the first substrate and the second substrate of the optical path control member according to the first embodiment are laminated.

Referring to FIGS. 3 and 4, the accommodating part 320 may extend in one direction. In detail, the accommodating part 320 may extend in a direction corresponding to the second direction 2A of the first substrate 110 or the second substrate 120. That is, the accommodating part 320 may extend in a direction corresponding to the width direction of the first substrate 110 or the second substrate 120.

Accordingly, both ends of the accommodating part 320 of the optical path control member according to the first embodiment may face both ends of the first substrate 110 or the second substrate 120, respectively. That is, one end of the accommodating part 320 may face one end of the first substrate 110 or the second substrate 120 in the second direction 2A, and the other end of the accommodating part 320 may face the other end of the first substrate 110 or the second substrate 120 in the second direction 2A.

Accordingly, both ends of the accommodating part 320 may contact the first sealing part 510 facing each other in the second direction 2A, and may be spaced apart from the second sealing part 520.

Meanwhile, although not shown in the drawings, the accommodating part 320 may extend to the second protrusion, and the accommodating part 320 on the second protruding part may not contain a light conversion material or may contain less light converting material than other accommodating parts.

Figure 5:
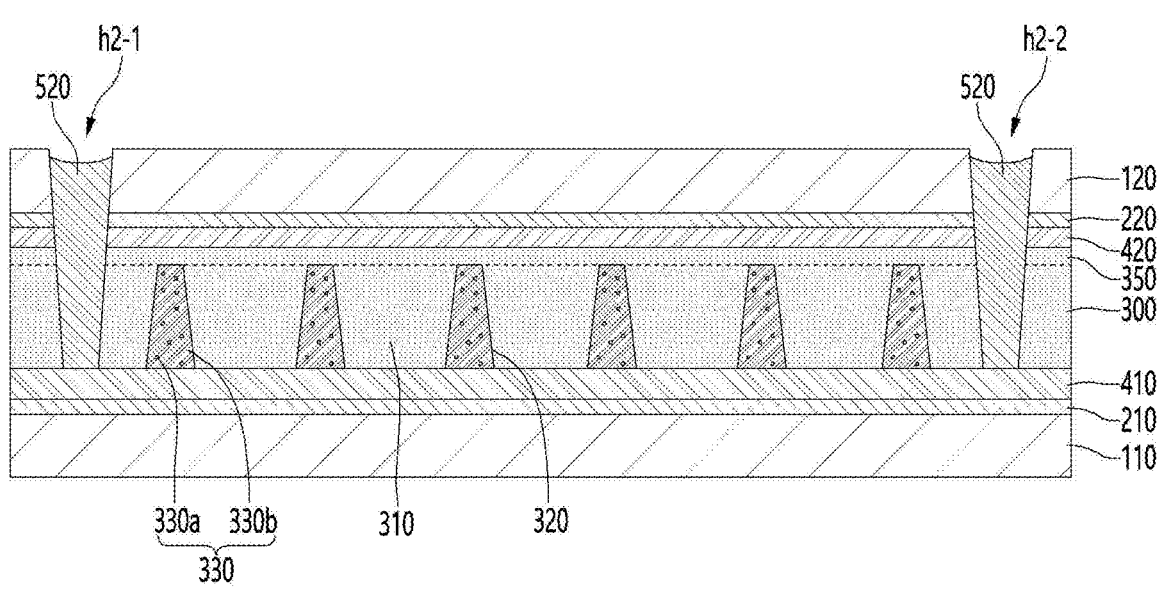
FIGS. 5 and 6 are cross-sectional views taken along the line A-A' of FIG. 1.
Figure 6:
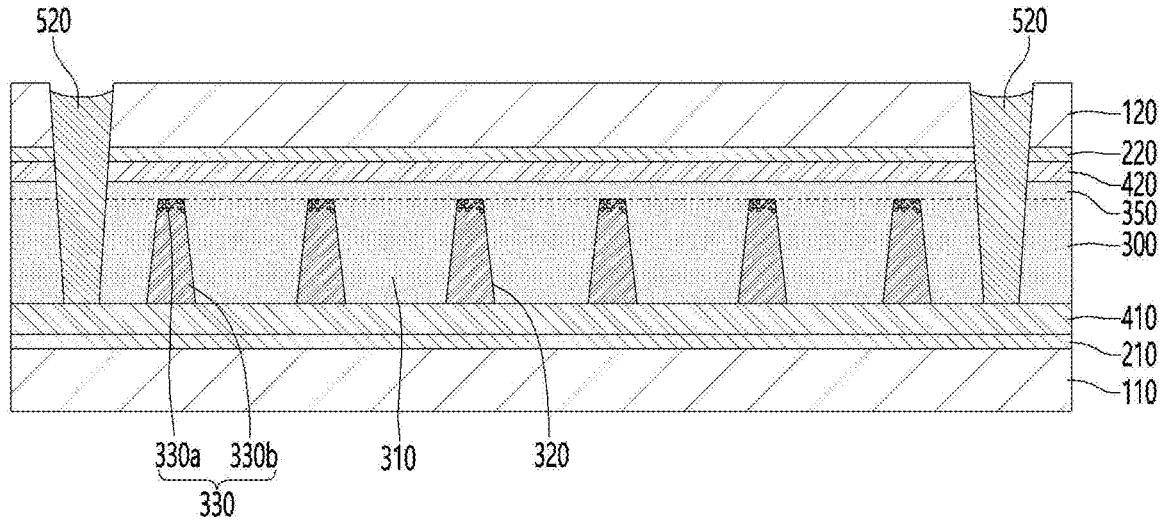

FIGS. 5 and 6 are cross-sectional views taken along line A-A' of FIG. 1.

Referring to FIGS. 5 and 6, the light conversion unit 300 may include the barrier rib part 310 and the accommodating part 320.

The barrier rib part 310 may be defined as a barrier rib region dividing the accommodating part. That is, the barrier rib part 310 is a barrier rib region dividing a plurality of accommodating parts and may transmit light. That is, light emitted in the direction of the first substrate 110 or the second substrate 120 may pass through the barrier rib part.

The barrier rib part 310 and the accommodating part 320 may extend in the second direction 2A of the first substrate 110 and the second substrate 120. That is, the barrier rib part 310 and the accommodating part 320 may extend in the width direction or the length direction of the first substrate 110 and the second substrate 120.

The barrier rib part 310 and the accommodating part 320 may be disposed in different widths. For example, the width of the barrier rib part 310 may be greater than that of the accommodating part 320.

In addition, the accommodating part 320 may be formed in a shape that extends from the first electrode 210 toward the second electrode 220 and narrows in width.

The barrier rib part 310 and the accommodating part 320 may be alternately disposed. In detail, the barrier rib part 310 and the accommodating part 320 may be alternately disposed. That is, each of the barrier rib parts 310 may be disposed between the accommodating part 320 adjacent to each other, and each accommodating part 320 may be disposed between the barrier rib parts 310 adjacent to each other.

The barrier rib part 310 may include a transparent material. The barrier rib part 310 may include a material capable of transmitting light.

The barrier rib part 310 may include a resin material. For example, the barrier rib part 310 may include a photocurable resin material. For example, the barrier rib part 310 may include a UV resin or a transparent photoresist resin. Alternatively, the barrier rib part 310 may include urethane resin or acrylic resin.

The accommodating part 320 may be formed to partially penetrate the light conversion unit 300. Accordingly, the accommodating part 320 may contact the adhesive layer 410 and be spaced apart from the buffer layer 420. Accordingly, a base part 350 may be formed between the accommodating part 320 and the buffer layer 420.

The light conversion material 330 including light conversion particles 330a and a dispersion liquid 330b in which the light conversion particles 330a are dispersed may be disposed in the accommodating part 320.

The dispersion liquid 330b may be a material that disperses the light conversion particles 330a. The dispersion liquid 330b may include a transparent material. The dispersion liquid 330b may include a non-polar solvent. In addition, the dispersion liquid 330b may include a material capable of transmitting light. For example, the dispersion liquid 330b may include at least one of halocarbon-based oil, paraffin-based oil, and isopropyl alcohol.

The light conversion particles 330a may be dispersed in the dispersion liquid 330b. In detail, the plurality of light conversion particles 330a may be spaced apart from each other in the dispersion liquid 330b.

The light conversion particle 330a may include a material capable of absorbing light. That is, the light conversion particles 330a may be light absorbing particles. The light conversion particles 330a may have a color. For example, the light conversion particle 330a may have a black-based color. For example, the light conversion particles 330a may include carbon black particles.

The surface of the light conversion particle 330a may be charged and may have a polarity. For example, the surface of the light conversion particle 330a may be negatively charged. Accordingly, the light conversion particle 330a may be moved toward the first electrode 210 or the second electrode 220 by applying the voltage.

The light transmittance of the accommodating part 320 may be changed by the light conversion particles 330a. In detail, the accommodating part 320 may be changed into a light blocking part and a light transmitting part by changing light transmittance by the light conversion particles 330a. That is, the accommodating part 320 may change the transmittance of light passing through the accommodating part 320 by dispersion and aggregation of the light conversion particles 330a disposed in the dispersion liquid 330b.

For example, the mode of the optical path member according to the first embodiment may be changed from the first mode to the second mode or from the second mode to the first mode by the voltage applied to the first electrode 210 and the second electrode 220.

In detail, in the optical path control member according to the first embodiment, the accommodating part 320 becomes a light blocking part in the first mode, and light of a specific angle can be blocked by the accommodating part 320. That is, the viewing angle of the user looking from the outside is narrowed, so that the optical path control member can be driven in the privacy mode.

Also, in the optical path control member according to the first embodiment, the accommodating part 320 becomes a light transmitting part in the second mode, and light may pass through both the barrier rib part 310 and the accommodating part 320. That is, the viewing angle of the user looking from the outside is widened, so that the optical path control member can be driven in the open mode.

The conversion from the first mode to the second mode, that is, the conversion of the accommodating part 320 from a light blocking part to a light transmitting part can be realized by the movement of the light conversion particles 330a in the accommodating part 320. That is, the surface of the light conversion particle 330a has electric charges, and when a voltage is applied, the light conversion particle 330a may move toward the first electrode or the second electrode according to the characteristics of the electric charge. That is, the light conversion particles 330a may be electrophoretic particles.

For example, when voltage is not applied to the optical path control member from the outside, the light conversion particles 330a of the accommodating part 320 are uniformly dispersed in the dispersion liquid 330b, and thereby the accommodating part 320 may block light by the light conversion particles 330a. Accordingly, in the first mode, the accommodating part 320 may be driven as a light blocking part.

Also, when a voltage is applied to the optical path control member from the outside, the light conversion particles 330a may move. For example, the light conversion particle 330a may move toward one end or the other end of the accommodating part 320 by the voltage transmitted by the first electrode 210 and the second electrode 220. That is, the light conversion particle 330a may move toward the first electrode 210 or the second electrode 220.

For example, when a voltage is applied to the first electrode 210 and/or the second electrode 220, an electric field is formed between the first electrode 210 and the second electrode 220, and the negatively charged light conversion particles 330a may move in the direction of the positive electrode among the electrodes 210 and 220 using the dispersion liquid 330b as a medium.

For example, referring to FIG. 5, in an initial mode or when no voltage is applied to the first electrode 210 and/or the second electrode 220, the light conversion particles 330a may be uniformly dispersed in the dispersion liquid 330b, and the accommodating part 320 may be driven as a light blocking part.

In addition, referring to FIG. 6, when a voltage is applied to the first electrode 210 and/or the second electrode 220, the light conversion particles 330a may move in the direction of the second electrode 220 in the dispersion liquid 330b. That is, the light conversion particles 330a may be moved in one direction, and the accommodating part 320 may be driven as a light transmitting part.

Accordingly, the optical path control member according to the first embodiment may be driven in two modes according to a user's surrounding environment. That is, when the user requires light transmission only at a specific viewing angle, the accommodation part is driven as the light blocking part, or in an environment in which the user requires high brightness, a voltage may be applied to drive the accommodation part as the light transmitting part.

Therefore, since the optical path control member according to the embodiment may be implemented in two modes according to the user's requirement, the optical path control member may be applied regardless of the user's environment.

A second sealing part 520 may be disposed on an outermost side of the optical path control member. In detail, the second sealing part 520 extending in the second direction 2A and facing each other may be disposed at an outermost side of the optical path control member in the first direction 1A.

The second sealing part 520 may be disposed inside the cutting parts described above. In detail, the second sealing part 520 may be disposed inside the 2-1 cutting part h2-1 and the 2-2 cutting part h2-2.

That is, the 2-1 cutting part h2-1 and the 2-2 cutting part h2-2 are formed to sequentially penetrate the second substrate 120, the second electrode 220, the buffer layer 420, the base part 350, and part or all of light conversion unit which is including the barrier rib part 310, and the second sealing part 520 may be formed by disposing a sealing material inside the 2-1 cutting part h2-1 and the 2-2 cutting part h2-2.

That is, one surface of the barrier rib part 310 or the adhesive layer 410 is exposed by the 2-1 cutting part h2-1 and the 2-2 cutting part h2-2, and the second sealing part 520 may contact the barrier rib part 310 or the adhesive layer 410.

The second sealing part 520 may contact the side surface of the second substrate 120. Also, the second sealing part 520 may contact a side surface of the second electrode 220. Also, the second sealing part 520 may contact a side surface of the buffer layer 420. Also, the second sealing part 520 may contact the side surface of the base part 350. Also, the second sealing part 520 may contact a side surface of the barrier rib part 310.

The second sealing part 520 is disposed on the side of the optical path control member, that is, on the side in the second direction 2A, and thereby impurities that may penetrate from the outside may be inhibited from penetrating into the light conversion unit 300.

The second sealing part 520 may be disposed while completely filling the 2-1 cutting part h2-1 and the 2-2 cutting part h2-2, or may be disposed at a height lower than the depth of the 2-1 cutting part h2-1 and the 2-2 cutting part h2-2. Accordingly, as shown in FIGS. 5 and 6, an upper surface of the second sealing part 520 may be disposed at a height lower than that of an upper surface of the second substrate 120. That is, the upper surface of the second sealing part 520 and the upper surface of the second substrate 120 may form a step. Also, the upper surface of the second sealing part 520 may be formed in a concave shape.

Meanwhile, FIGS. 5 and 6 show that the 2-1 cutting part h2-1 and the 2-2 cutting part h2-2 are formed to a depth exposing one surface of the adhesive layer 410, but the embodiment is not limited thereto.

That is, the depth of the 2-1 cutting part h2-1 and the 2-2 cutting part h2-2 may vary depending on the process method and process time for forming the 2-1 cutting part h2-1 and the 2-2 cutting part h2-2.

For example, at least one cutting part of the 2-1 cutting part h2-1 and the 2-2 cutting part h2-2 is formed to a depth that partially penetrates the light conversion part 300, and one surface of the base part, the barrier rib part 310 or the accommodating part 320 may be exposed by the 2-1 cutting part h2-1 and the 2-2 cutting part h2-1.

Accordingly, the second sealing part 520 may be spaced apart from the adhesive layer 410.

Alternatively, at least one cutting part of the 2-1 cutting part h2-1 and the 2-2 cutting part h2-2 is formed to a depth that entirely penetrates the light conversion part 300, and one surface of the adhesive layer 410 may be exposed by the 2-1 cutting part h2-1 and the 2-2 cutting part h2-1.

Alternatively, at least one cutting part of the 2-1 cutting part h2-1 and the 2-2 cutting part h2-2 is formed to a depth that partially penetrates the first electrode 210, and one surface of the first electrode 210 may be exposed by the 2-1 cutting part h2-1 and the 2-2 cutting part h2-1.

Alternatively, at least one cutting part of the 2-1 cutting part h2-1 and the 2-2 cutting part h2-2 is formed to a depth that partially penetrates the first substrate 110, and one surface of the first substrate 110 may be exposed by the 2-1 cutting part h2-1 and the 2-2 cutting part h2-1.

Figures 7, 8:
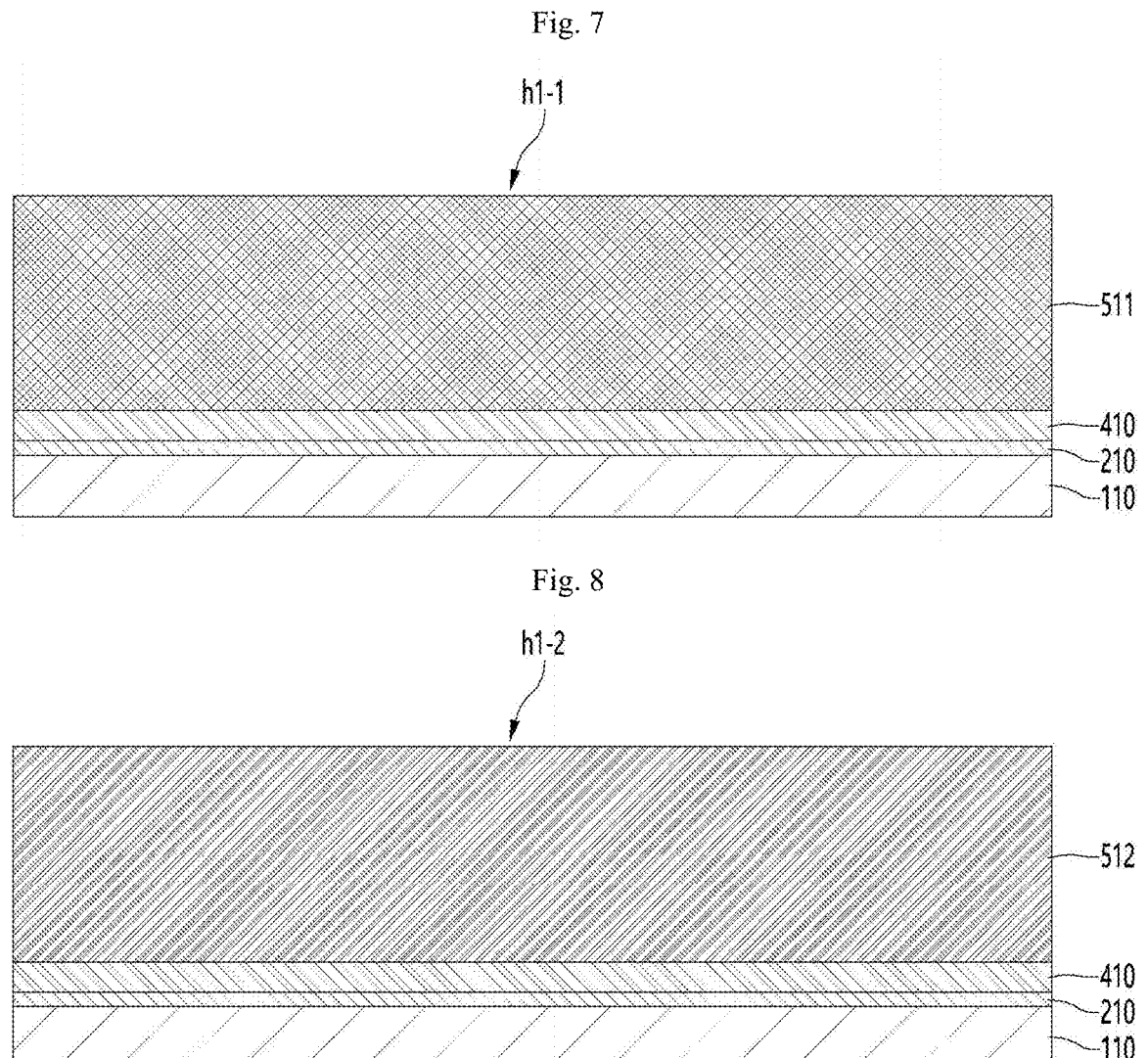
FIG. 7 is a cross-sectional view taken along the line B-B' of FIG. 1.
FIG. 8 is a cross-sectional view taken along line C-C' of FIG. 1.

FIGS. 7 and 8 are cross-sectional views taken along areas B-B' and C-C' of FIG. 1. That is, FIG. 7 is a cross-sectional view of both ends of the 1-1 sealing part 511 among the first sealing parts 510, and FIG. 8 is a cross-sectional view of both ends of the 1-2 sealing part 512 among the first sealing parts 510.

Referring to FIGS. 7 and 8, the 1-1 sealing part 511 may be disposed inside the 1-1 cutting part h1-1, and the 1-2 sealing part 512 may be disposed inside the 1-2 cutting part h1-2. The 1-1 sealing part 511 and the 1-2 sealing part 512 may contact the side surface of the second substrate 120. In addition, the 1-1 sealing part 511 and the 1-2 sealing part 512 may contact the side surface of the second electrode 220. In addition, the 1-1 sealing part 511 and the 1-2 sealing part 512 may contact the side surface of the buffer layer 420. In addition, the 1-1 sealing part 511 and the 1-2 sealing part 512 may contact the side surface of the base part 350. In addition, the 1-1 sealing part 511 and the 1-2 sealing part 512 may contact the side surface of the barrier rib part 310.

For example, the 1-1 cutting part h1-1 and the 1-2 cutting part h1-1 are formed to pass through all of the second substrate 120, the second electrode 220, the buffer layer 420, and the light conversion unit 300, and the 1-1 sealing part 511 and the 1-2 sealing part 512 may contact a side surface of the second substrate 120, a side surface of the second electrode 220, a side surface of the buffer layer 420, a side surface of the base part 350, and a side surface of the barrier rib part 310. The 1-1 cutting part h1-1 and the 1-2 cutting part h1-2 may contact one end of the second substrate 120 in the first direction and both ends of the second substrate 120 in the second direction.

The 1-1 cutting part h1-1 and the 1-2 cutting part h1-2 may be formed to sequentially penetrate the second substrate 120, the second electrode 220, the buffer layer 420, the base part 350, and part or all of light conversion unit which is including the barrier rib part 310. Subsequently, a sealing material may be disposed inside the 1-1 cutting part h1-1 and the 1-2 cutting part h1-2 to form the 1-1 sealing part and the 1-2 sealing part.

The sealing material of the 1-1 sealing part 511, the 1-2 sealing part 512, and the second sealing part 520 may include the same material. Alternatively, the sealing material of the 1-1 sealing part 511, the 1-2 sealing part 512 and the second sealing part 520 may include different materials from each other.

For example, at least one of the 1-1 sealing part 511, the 1-2 sealing part 512, and the second sealing part 520 may include a photocurable material. In addition, at least one of the 1-1 sealing part 511, the 1-2 sealing part 512, and the second sealing part 520 may include a material having low reactivity with the light conversion material. In addition, at least one of the 1-1 sealing part 511, the 1-2 sealing part 512, and the second sealing part 520 may include polyurethane acrylate Since the 1-1 cutting part h1-1 and the 1-2 h1-2 is formed while sequentially penetrating the second substrate 120, the second electrode 220, the buffer layer 420, the base part 350, and the light conversion unit which is including the barrier rib unit, one surface of the adhesive layer 410 may be exposed through the 1-1 cutting part h1-1 and the 1-2 cutting part h1-2.

Accordingly, the 1-1 sealing part 511 disposed inside the 1-1 cutting part h1-1 and the 1-2 sealing part 512 disposed inside the 1-2 cutting part h1-2 may contact the adhesive layer 410 inside the 1-1 cutting part h1-1 and the 1-2 cutting part h1-2.

The 1-1 sealing part 511 disposed inside the 1-1 cutting part h1-1 and the 1-3 cutting part h1-3 may seal the accommodating part of the light conversion unit 300. That is, the 1-1 sealing part 511 may seal the light conversion material 330 disposed inside the accommodating part 320. That is, the 1-1 sealing part 511 may inhibit the light conversion material 330 accommodated in the accommodating part 320 from leaking out, and impurity that may permeate from the outside may be inhibited from penetrating into the light conversion unit 300.

In addition, the 1-2 sealing part 512 disposed inside the 1-2 cutting part h1-2 and the 1-4 cutting part h1-4 can inhibit the light conversion material from leaking during a process of injecting the light conversion material into the accommodating part 320.

That is, the 1-1 cutting part h1-1 among the cutting parts may be an injection part for injecting a light conversion material into the accommodating part 320, and the 1-3 cutting part h1-3 among the cutting parts may be exit part that move the light conversion material by vacuum suctioning the light conversion material injected into the accommodating part 320.

In this case, the light conversion material 330 flowing into the injection part may move in a direction of the 1-2 cutting part h1-2 instead of a direction of the 1-3 cutting part h1-3. Accordingly, the light conversion material 330 also flows into the bezel area, and thereby visibility may be reduced due to a contrast difference between the light conversion area and the bezel area.

Accordingly, excessive movement of the light conversion material into the bezel area may be inhibited by additionally disposing the 1-2 cutting par h1-2 in an area adjacent to the 1-1 cutting part h1-1 defined as an injection part.

Similarly, the light conversion material 330 moved to the exit part may pass through the 1-3 cutting part h1-3 and move in the direction of the 1-4 cutting part h1-4. Accordingly, the light conversion material 330 also flows into the bezel area, and thereby visibility may be reduced due to a contrast difference between the light conversion area and the bezel area.

Accordingly, excessive movement of the light conversion material into the bezel area may be inhibited by additionally disposing the 1-4 cutting par h1-4 in an area adjacent to the 1-3 cutting part h1-3 defined as an exit part.

Accordingly, since the optical path control member according to the embodiment includes a 1-1 sealing part for sealing the light conversion material and a 1-2 sealing part for blocking the movement of the light conversion material, reliability and visibility of the optical path control member can be improved.

Figure 9:
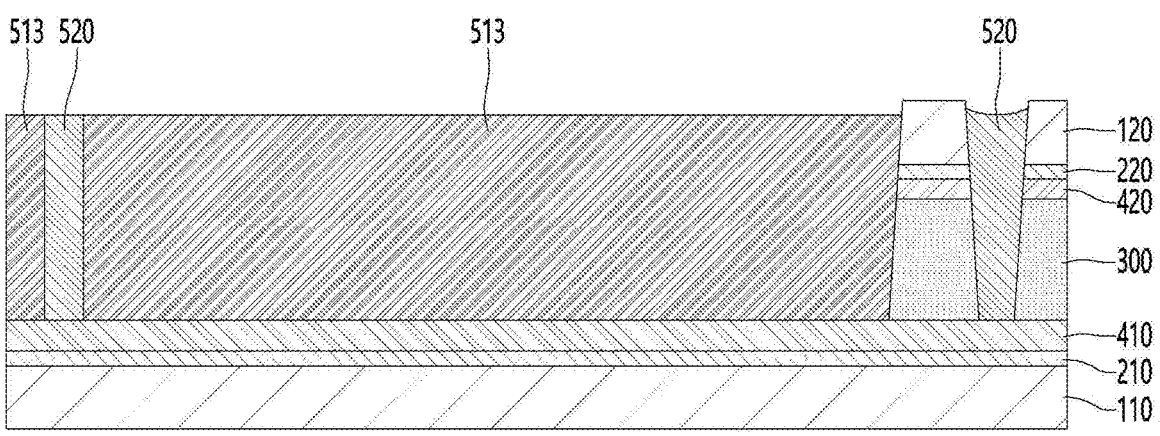
FIG. 9 is a cross-sectional view taken along the line D-D' of FIG. 1.
Figure 10:
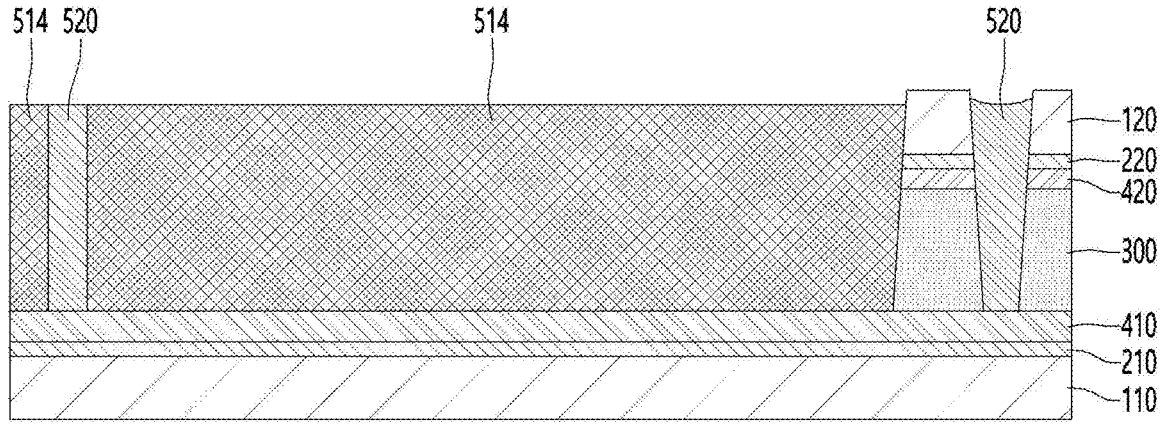
FIG. 10 is a cross-sectional view taken along the line E-E' of FIG. 1.

FIG. 9 is a cross-sectional view taken along the line D-D' of FIG. 1, and FIG. 10 is a cross-sectional view taken along the line E-E' of FIG. 1. That is, FIG. 9 is a cross-sectional view of both ends of the sealing part to which the 1-3 sealing part 513 and the second sealing part 520 are connected in the first direction, and FIG. 10 is a cross-sectional view of both ends of the sealing part to which the 1-4 sealing part 5114 and the second sealing part 520 are connected in the first direction.

Referring to FIGS. 9 and 10, the 1-3 cutting part h1-3 and the 2-1 cutting part h2-1 may be connected to each other. Also, the 1-4 cutting part h1-4 and the 2-1 cutting part h2-1 may be connected to each other.

In addition, the 1-3 cutting part h1-3 and the 1-4 cutting part h1-4 may be spaced apart from the 2-2 cutting part h2-2. That is, one end of the 1-3 cutting part h1-3 and the 1-4 cutting part h1-4 may be spaced apart from the 2-2 cutting part h2-2.

The 1-3 cutting part h1-3, the 1-4 cutting part h1-4 and the 2-2 cutting part h2-2 are spaced apart from each other, and thereby the open area formed between the 1-3 cutting part h1-3, the 1-4 cutting part h1-4, and the 2-2 cutting part h2-2 may be formed on the second substrate.

The electrode connecting part 700 of the second connection area CA2 disposed on the second protrusion PA2 of the second substrate 120 and the second electrode 220 may be connected without being disconnected by the second electrode 220 disposed in the open area OA. That is, the light conversion material 300 inside the accommodating part 320 disposed between the first sealing part 510 and the second sealing part 520 may receive current and voltage transmitted by the open area OA.

Since the 1-3 cutting part h1-3, the 1-4 cutting part h1-4, and the 2-1 cutting part h2-1 are connected, the 1-3 sealing part 513 and the 1-4 sealing part 514 disposed inside the 1-3 cutting part h1-3 and the 1-4 cutting part h1-4 may be connected to the second sealing part 520 disposed in the 2-1 cutting part h2-1. In addition, since the 1-3 cutting part h1-3, the 1-4 cutting part h1-4, and the 2-2 cutting part h2-1 are spaced apart from each other, the first sealing part 511 disposed inside the 1-3 cutting part h1-3 and the 1-4 cutting part h1-4 may be spaced apart from the second sealing part 520 disposed on the 2-2 cutting part h2-2.

Figure 11:
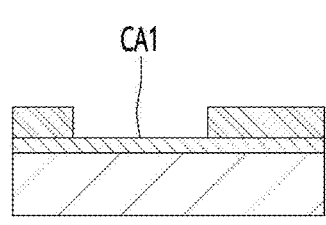
FIG. 11 is a cross-sectional view taken along the line F-F' of FIG. 1.
Figure 11:
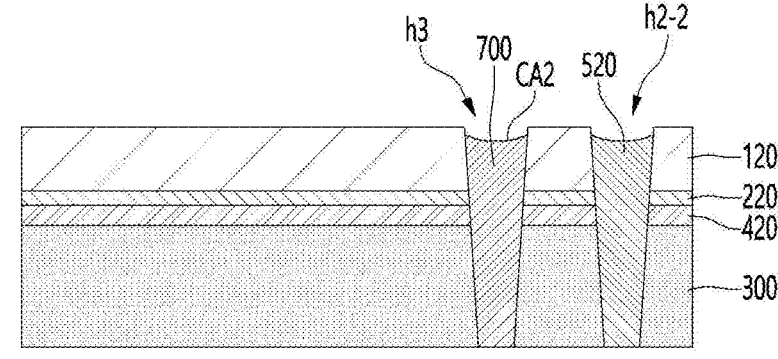

FIG. 11 is a cross-sectional view taken along the line F-F' of FIG. 1. That is, FIG. 11 is a cross-sectional view taken along protrusion areas of the first substrate and the second substrate.

Referring to FIG. 11, the first protrusion PA1 of the first substrate 110 and the second protrusion PA2 of the second substrate 120 may be spaced apart from each other. That is, the first protrusion PA1 of the first substrate 110 and the second protrusion PA2 of the second substrate 120 may be spaced apart from each other in the first direction 1A.

Therefore, the first substrate 110, the first electrode 210, and the adhesive layer 410 may not be disposed under the second protrusion PA2.

Accordingly, since the first connection area CA1 disposed on the first protrusion PA1 and the second connection area CA2 disposed on the second protrusion PA2 are physically separated from each other, the first connection area CA1 and the second connection area CA2 may be inhibited from being electrically connected to each other by the adhesive layer.

The first connection area CA1 may be disposed on the first protrusion PAL The first electrode 210 may be exposed in the first connection area CAL That is, since the first electrode 210 on the first substrate 110 is exposed by partially removing the adhesive layer 410 on the first protrusion PA1, an upper surface of the first electrode 210 may be exposed in the first connection area CAL That is, the first electrode 210 exposed in the first connection area CA1 may be a first connection electrode connected to an external printed circuit board or a flexible printed circuit board.

In addition, the second connection area CA2 may be disposed on the second protrusion PA2. A third cutting part h3 may be formed in the second connection area CA2. The electrode connection part 700 containing a conductive material may be disposed inside the third cutting part h3.

The electrode connection part 700 may include a material different from that of at least one of the first electrode 210 and the second electrode 220. In addition, the light transmittance of the electrode connection part 700 may be smaller than the light transmittance of at least one of the first electrode 210 and the second electrode 220.

For example, the electrode connection part 700 may include metal. In detail, the electrode connection part 700 may include a metal paste in which metal particles are dispersed in a binder.

The electrode connection part 700 may contact the side surface of the second substrate 120. Also, the electrode connection part 700 may contact the side surface of the second electrode 220. Also, the electrode connection part 700 may contact the side surface of the buffer layer 420. Also, the electrode connection part 700 may contact the side surface of the base part 350. Also, the electrode connection part 700 may contact the side surface of the barrier rib part 310.

That is, the electrode connection part 700 may contacts a side surface of at least one of the second substrate 120, the second electrode 220, the buffer layer 420, the base part 350, and the barrier rib part 310.

In addition, a protective layer may be additionally disposed on the lower surface of the electrode connection part. Accordingly, oxidation or denaturation of the electrode connection part exposed to the outside can be inhibited.

The upper surface of the electrode connection part 700 may be disposed on the same plane as or lower than the upper surface of the second substrate 120. For example, the upper surface of the electrode connection part 700 may be disposed on the same plane as the upper surface of the second substrate 120. Alternatively, the upper surface of the electrode connection part 700 may be disposed lower than the upper surface of the second substrate 120.

Accordingly, the upper surface of the electrode connection part 700 and the upper surface of the second substrate 120 are formed on the same plane without a step difference, or may be disposed with a step difference such that the upper surface of the electrode connection part 700 is low.

Accordingly, since the overall thickness of the optical path control member is inhibited from being increased due to the height of the electrode connection part 700, the overall thickness of the optical path control member can be reduced.

Since the electrode connection part 700 is electrically connected to the second electrode 220, the electrode connection part 700 may be exposed to the outside of the second substrate 120. That is, the electrode connection part 700 may be exposed to the second protruding part PA2 of the second substrate 120. That is, the upper surface of the electrode connection part 700 may be exposed in the second connection area CA2.

Accordingly, the electrode connection part 700 exposed in the second connection area CA2 may be a second connection electrode connected to an external printed circuit board or a flexible printed circuit board.

Accordingly, the first electrode 210 and the second electrode 220 are connected to the same printed circuit board or flexible printed circuit board by a first connection electrode of a first connection area and a second connection electrode of a second connection area, respectively, and the first electrode 210 and the second electrode 220 may be electrically connected to each other.

In this case, since the first connection electrode and the second connection electrode are disposed on the same surface, when connecting the first connection electrode and the second connection electrode with one printed circuit board, they can be easily connected.

Alternatively, the first electrode 210 and the second electrode 220 are connected to the different printed circuit board or flexible printed circuit board by a first connection electrode of a first connection area and a second connection electrode of a second connection area, respectively, and the first electrode 210 and the second electrode 220 may be electrically connected to each other. That is, the first connection electrode may be connected to a first circuit board, and the second connection electrode may be connected to a second circuit board different from the first circuit board.

Figure 12:
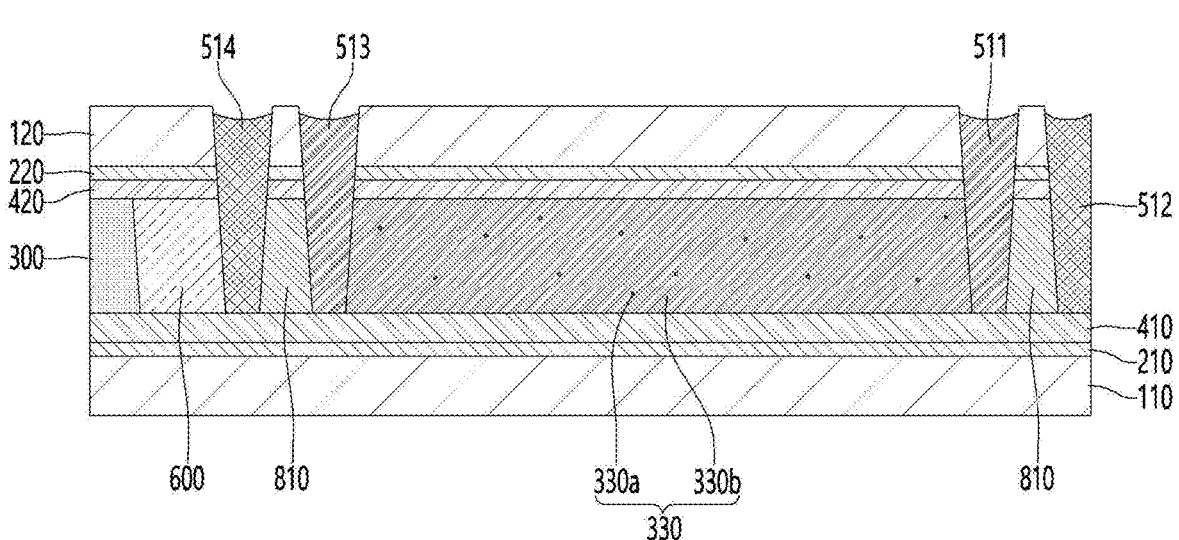
FIG. 12 is a cross-sectional view taken along the line G-G' of FIG. 1.
Figure 13:
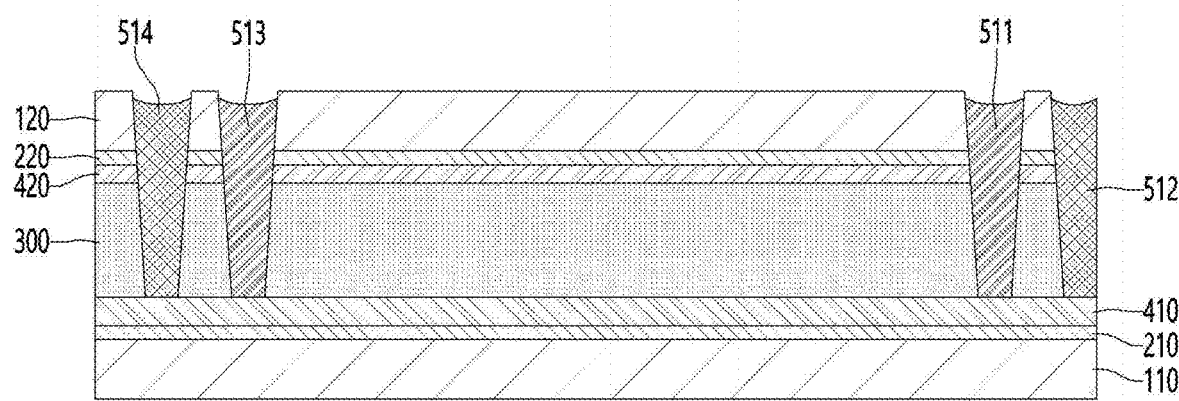
FIG. 13 is a cross-sectional view taken along the line H-H' of FIG. 1.

FIG. 12 is a cross-sectional view taken along the line G-G' of FIG. 1, and FIG. 13 is a cross-sectional view taken along the line H-H' of FIG. 1. That is, FIG. 12 is a cross-sectional view taken in the direction of the accommodating part, and FIG. 13 is a cross-sectional view taken in the direction of the barrier rib part.

Referring to FIG. 12, the light conversion material 330 may be disposed inside the accommodating part 320. In detail, the light conversion material 330, the 1-1 sealing part 511, the 1-2 sealing part, the 1-3 sealing part 513, and a 1-4 sealing part 514 may be disposed inside the accommodating part 320.

The 1-1 sealing part 511 and the 1-3 sealing part 513 are disposed at one end and the other end of the accommodating part 320 in the second direction 2A and seal the light conversion material 330 disposed inside the accommodating part 320.

Since the light conversion material 330 inside the accommodating part 320 is sealed by the 1-1 sealing part 511 and the 1-3 sealing part 513, leakage to the outside of the optical path control member may be inhibited.

In addition, the 1-2 sealing part 512 and the 1-4 sealing part 514 may be disposed in regions adjacent to the 1-1 sealing part 511 and the 1-3 sealing part 513. When injecting the light conversion material 330, the 1-2 sealing part 512 and the 1-4 sealing part 514 inhibit the light conversion material 300 from moving outwardly from the 1-2 sealing part 512 and the 1-4 sealing part 514.

A mixed area 810 may be formed in a region between the 1-1 sealing part 511 and the 1-2 sealing part 512 and in a region between the 1-3 sealing part 513 and the 1-4 sealing part 514.

The mixed area 810 may be defined as a region in which the light conversion material 330 moved in the direction of the 1-2 sealing part 512 and the 1-4 sealing part 514 and the sealing material are mixed.

In addition, the dam part 600 may be disposed outside the 1-4 sealing parts 514. The dam part 600 may be disposed inside the accommodating part 320.

The dam part 600 may contact the 1-4 sealing parts 514 inside the accommodating part 320.

When injecting the light conversion material 330 into the accommodating part 320, the dam part 600 controls the injection length of the light conversion material, and the dam part 600 can inhibit the light conversion material 330 from overflowing toward the outside of the dam, that is, toward the electrode connection part 700.

Referring to FIG. 13, the barrier rib part 310 is disposed in an area corresponding to the barrier rib part 310, the barrier rib part may be entirely removed from the second substrate to form the 1-1 sealing part 511, the 1-2 sealing part 512, the 1-3 sealing part 513, and the 1-4 sealing part 514.

That is, the 1-1 sealing part 511, the 1-2 sealing part 512, the 1-3 sealing part 513, and the 1-4 sealing part 514 may be disposed in the region where the barrier rib part is disposed. Accordingly, the area of the 1-1 sealing part 511, the 1-2 sealing part 512, the 1-3 sealing part 513, and the 1-4 sealing part 514 may be increased by the size of the removal of the barrier rib part.

Therefore, even if the thicknesses of the 1-1 sealing part 511, the 1-2 sealing part 512, the 1-3 sealing part 513, and the 1-4 sealing part 514 do not increase, areas of the 1-1 sealing part 511, the 1-2 sealing part 512, the 1-3 sealing part 513, and the 1-4 sealing part 514 may be increased. In addition, since the contact area of the 1-1 sealing part 511, the 1-2 sealing part 512, the 1-3 sealing part 513, and the 1-4 sealing part 514 is increased, the adhesive property of the first sealing part may be improved.

Accordingly, sealing characteristics of the light conversion material may be improved by the 1-1 sealing part 511, the 1-2 sealing part 512, the 1-3 sealing part 513, and the 1-4 sealing part 514.

The optical path control member according to the first embodiment may include the 1-1 cutting part, the 1-2 cutting part, the 1-3 cutting part, and the 1-4 cutting part formed on the second substrate by penetrating the second substrate, the second electrode, the buffer layer, and all or part of the light conversion unit.

In addition, the 1-1 sealing part, the 1-2 sealing part, the 1-3 sealing part and the 1-4 sealing part may be disposed inside the 1-1 cutting part, the 1-2 cutting part, the 1-3 cutting part and the 1-4 cutting part, respectively.

The 1-1 sealing part and the 1-3 sealing part disposed inside the 1-1 cutting part and the 1-3 cutting part may seal the accommodating part of the light conversion unit 300. That is, the 1-1 sealing part and the 1-3 sealing part may inhibit impurities that may penetrate from the outside from penetrating into the light conversion unit while inhibiting the light conversion material accommodated in the accommodating part from leaking out to the outside.

In addition, the 1-2 sealing part and the 1-4 sealing part disposed inside the 1-2 cutting part and the 1-4 cutting part may inhibit the light conversion material from leaking during a process of injecting the light conversion material into the accommodating part.

Accordingly, since the optical path control member according to the embodiment includes the 1-1 sealing part and the 1-2 sealing part for sealing the light conversion material, and the 1-2 sealing part and the 1-4 sealing part blocking movement of the light conversion material, reliability and visibility of the optical path control member can be improved.

The first sealing part and the second sealing part may be disposed to seal an injection part and an exit part of the accommodating part accommodating the light conversion material, and may extend along a side surface area of the light conversion part, that is, a side surface area in a first direction.

Accordingly, it is possible to inhibit the light conversion material inside the accommodating part from leaking out of the light conversion unit by the first sealing part. And it is possible to inhibit impurities from penetrating into the light conversion unit from the outside by the first sealing part and the second sealing part, and thereby reliability of the optical path control member can be improved.

In addition, since the first sealing part and the second sealing part are disposed inside the cutting parts formed on the second substrate, compared to forming the first sealing part and the second sealing part outside the light conversion unit, the size of the optical path control member may be reduced, and the material of the sealing part may be inhibited from being denatured by the external environment, and thereby the sealing property of the optical path control member can be improved.

Further, in the optical path control member according to the first embodiment, the first connection electrode may be disposed on the first protrusion formed on the first substrate, and the second connection electrode may be disposed on the second protrusion formed on the second substrate.

The first protruding part and the second protruding part may protrude only as much as an area in which the first connection electrode and the second connection electrode can be formed, without entirely protruding the surfaces of the first substrate and the second substrate.

Accordingly, areas of the first protrusion and the second protrusion may be reduced. Therefore, when the optical path control member is combined with a display panel and applied to a display device, other elements of the display device may be disposed in areas not corresponding to the first protrusion and the second protrusion, and thereby a bezel area of the display device may be reduced.

That is, the optical path control member according to the first embodiment reduces the size of the bezel area where the connection electrode is disposed, so that the bezel area of the display device to which the optical path control member is applied can also be reduced.

Hereinafter, the optical path control member according to a second embodiment will be described with reference to FIGS. 14 to 18.

In the description of the optical path control member according to the second embodiment, descriptions of identical or similar elements to those of the optical path control member according to the first embodiment described above are omitted, and the same reference numerals are assigned to the same components.

Figure 15:
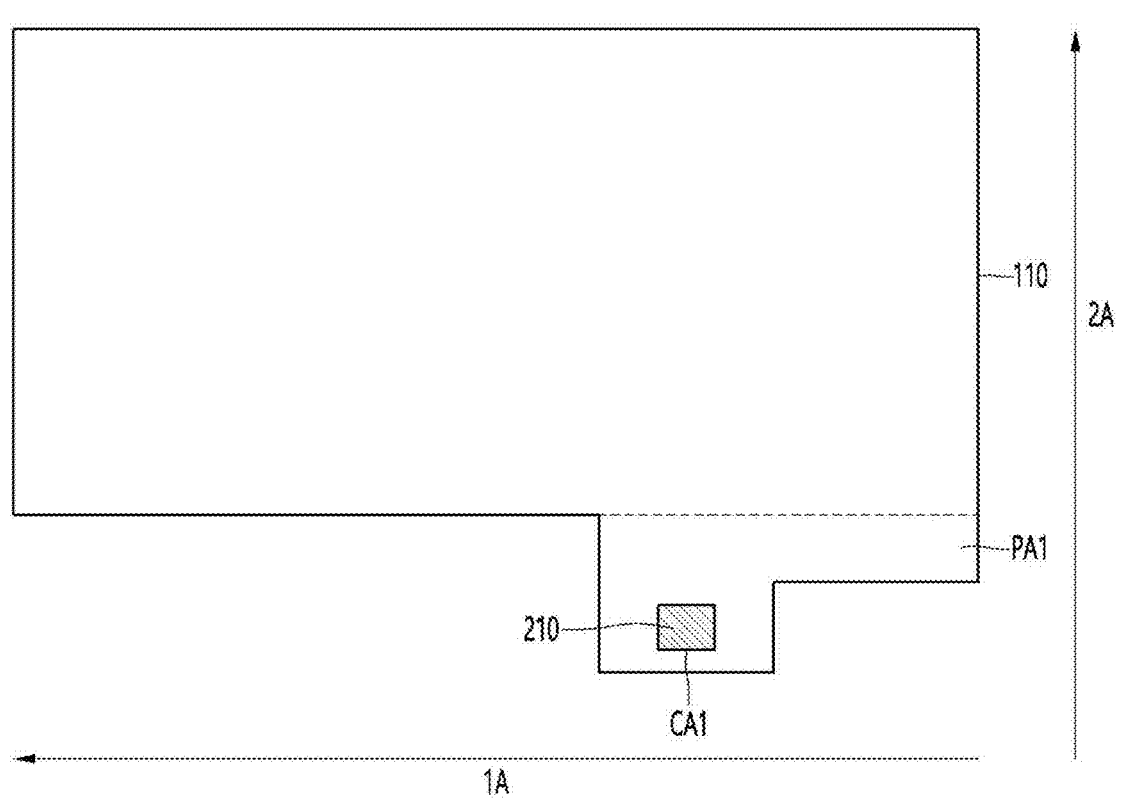
FIG. 15 is a top view of the first substrate of the optical path control member according to the second embodiment.
Figure 16:
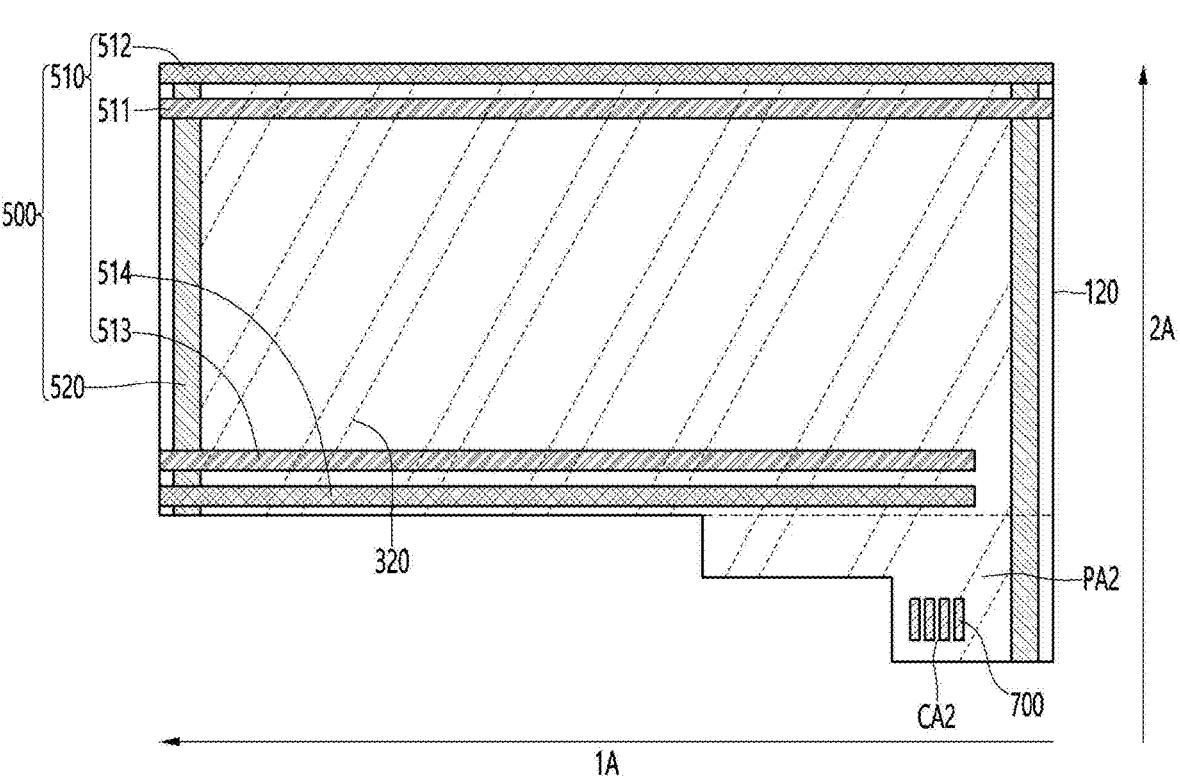
FIG. 16 is a top view of the second substrate of the optical path control member according to the second embodiment.
Figure 17:
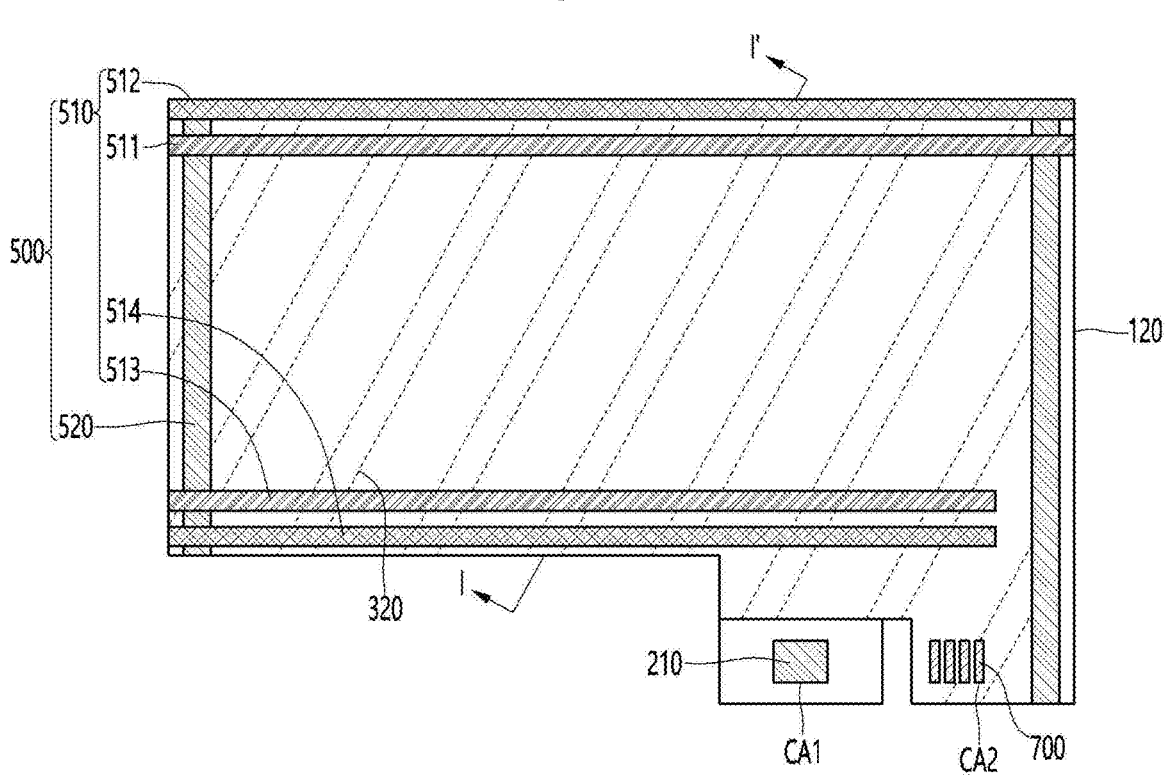
FIG. 17 is a top view of the second substrate in which the first substrate and the second substrate of the optical path control member according to the second embodiment are laminated.

Referring to FIGS. 15 to 17, in the optical path control member according to the second embodiment, unlike the first embodiment described above, the accommodating part 320 of the light conversion unit may be tilted at a constant angle.

Referring to FIGS. 14 to 17, the accommodating part 320 may extend in a direction different from the first direction 1A and the second direction 2A.

Accordingly, one end and the other end of at least one of the accommodating parts 320 may contact the first sealing part 510, and one end and the other end of the at least one accommodating part may contact the first sealing part 510 and the second sealing part 520.

When the optical path control member is combined with a display panel to form a display device, since the accommodating part is tilted and disposed at a predetermined inclination angle, a moire phenomenon caused by overlapping the accommodating part of the optical path control member and the pattern part of the display panel may be inhibited.

That is, one end and the other end of the accommodating part 320 according to the second embodiment may be formed on both the outer surface in the first direction and the outer surface in the second direction of the optical path control member.

Figure 14:
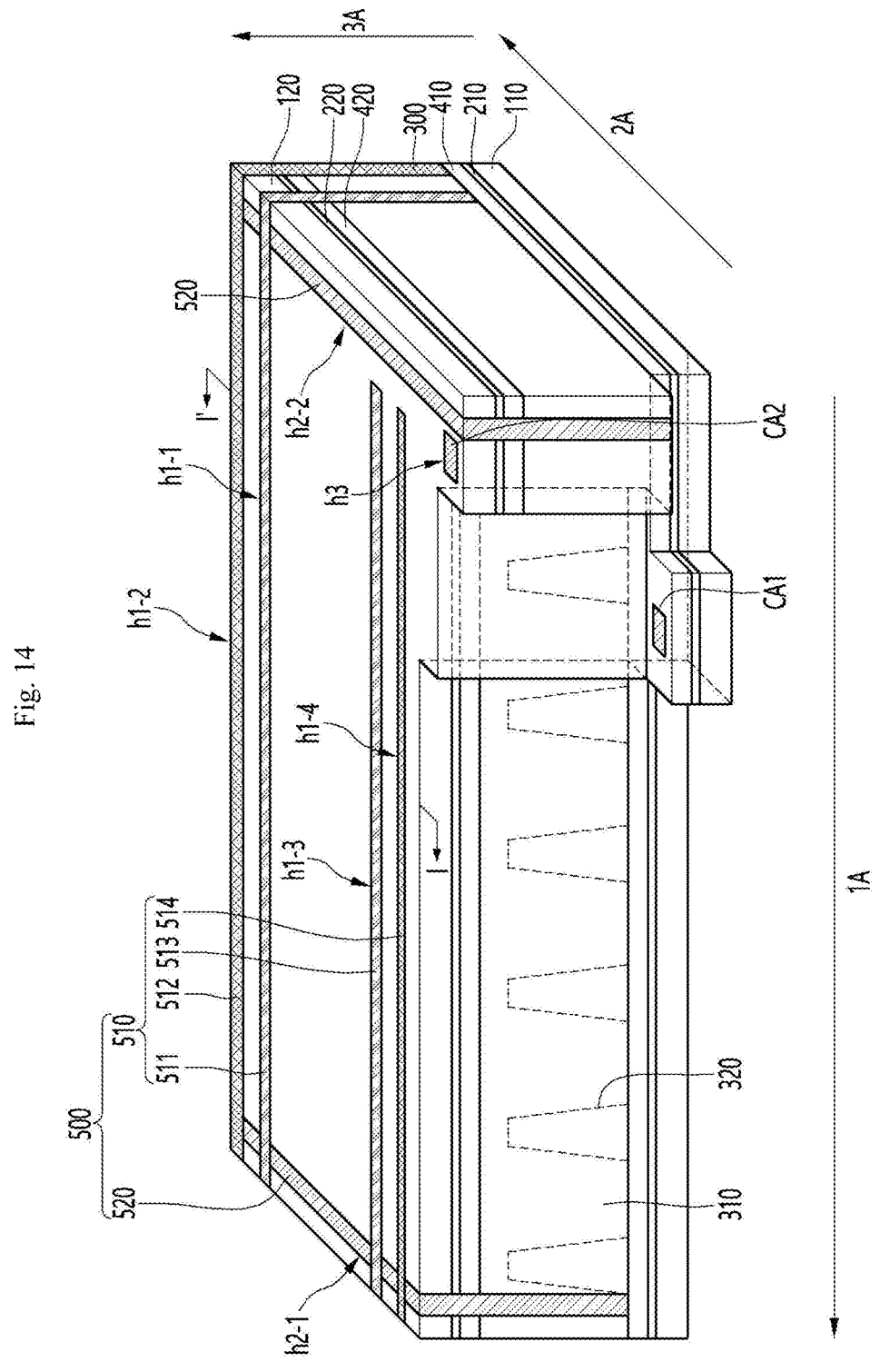
FIG. 14 is a perspective view of the optical path control member according to a second embodiment.
Figure 18:
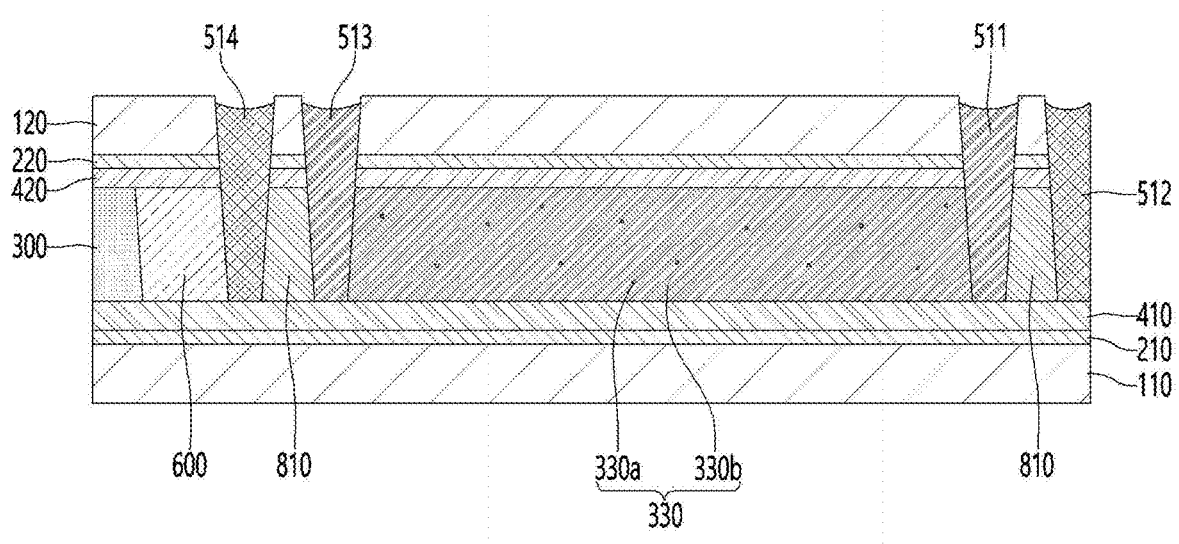
FIG. 18 is a cross-sectional view taken along the line I-I' of FIG. 14.

FIG. 18 is a cross-sectional view taken along the line I-I' of FIGS. 14 and 17. That is, FIG. 18 is a cross-sectional view of one accommodating part of the optical path control member cut in the direction of the inclination angle.

Referring to FIG. 18, the light conversion material 330 may be disposed inside the accommodating part 320. In detail, the light conversion material 330, the 1-1 sealing part 511, the 1-2 sealing part 512, the 1-3 sealing part 513, and a 1-4 sealing part 514 may be disposed inside the accommodating part 320.

The 1-1 sealing part 511 and the 1-3 sealing part 513 may be disposed at one end and the other end of the accommodating part 320 in the second direction, and seal the light conversion material 330 disposed inside the accommodating part 320.

The light conversion material 330 inside the accommodating part 320 is sealed by the 1-1 sealing part 511 and the 1-3 sealing part 513, and thereby the light conversion material 330 may be inhibited from leaking out of the optical path control member.

In addition, the 1-2 sealing part 512 may be disposed in an area adjacent to the 1-1 sealing part 511, and the 1-4 sealing part 514 may be disposed in an area adjacent to the 1-3 sealing part 513. When the light conversion material 330 is injected, the light conversion material 330 may be inhibited from moving to the outside of the 1-2 sealing part 512 and the 1-4 sealing part 514 by the 1-2 sealing part 512 and the 1-4 sealing part 514.

The mixed area 810 may be formed in a region between the 1-1 sealing part 511 and the 1-2 sealing part 512 and in a region between the 1-3 sealing part 513 and the 1-4 sealing part 514.

The mixed area 810 may be defined as a region in which the light conversion material 330 moved in the direction of the 1-2 sealing part 512 and the 1-4 sealing part 514 and the sealing material are mixed.

In addition, the dam part 600 may be disposed outside the 1-4 sealing parts 514. The dam part 600 may be disposed inside the accommodating part 320.

The dam part 600 may contact the 1-2 sealing parts 512 inside the accommodating part 320.

When injecting the light conversion material 330 into the accommodating part 320, the dam part 600 controls the injection length of the light conversion material, and the dam part 600 can inhibit the light conversion material 330 from overflowing toward the outside of the dam, that is, toward the electrode connection part 700.

Hereinafter, optical path control members according to other embodiments will be described with reference to FIGS. 19 to 21.

Figure 19:
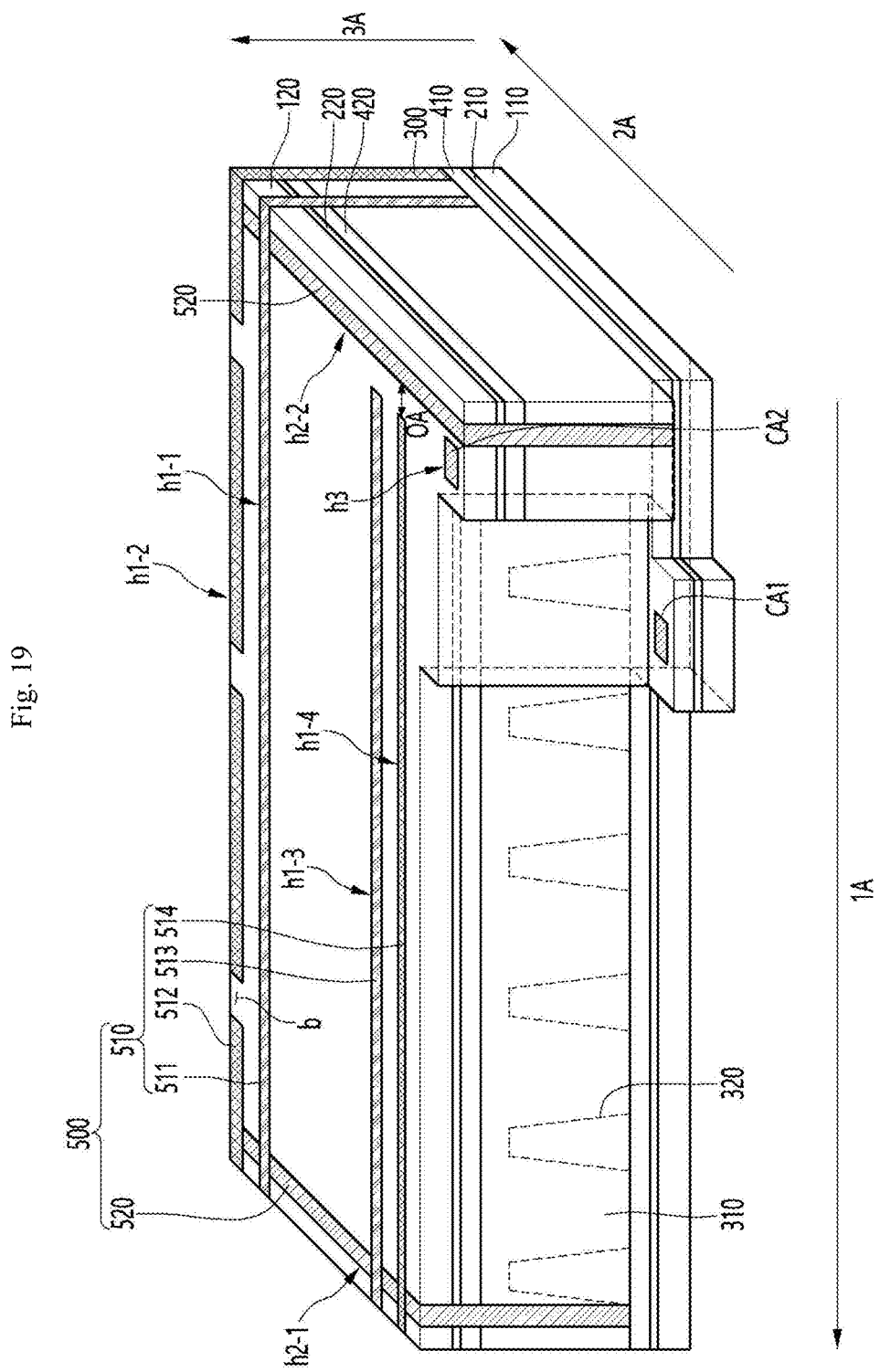
FIG. 19 is a perspective view of an optical path control member according to a third embodiment.
Figure 20:
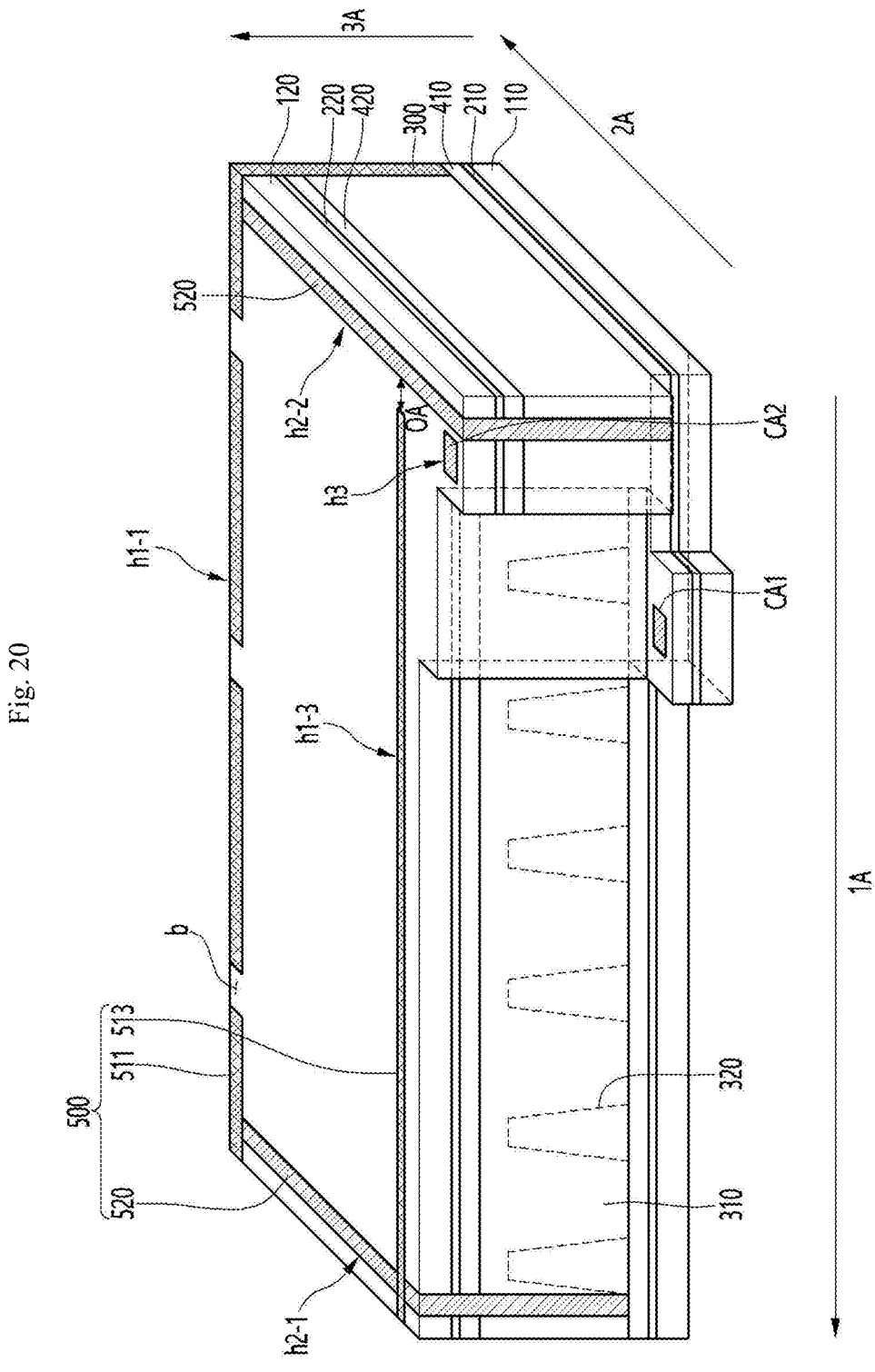
FIG. 20 is a perspective view of an optical path control member according to a fourth embodiment.
Figure 21:
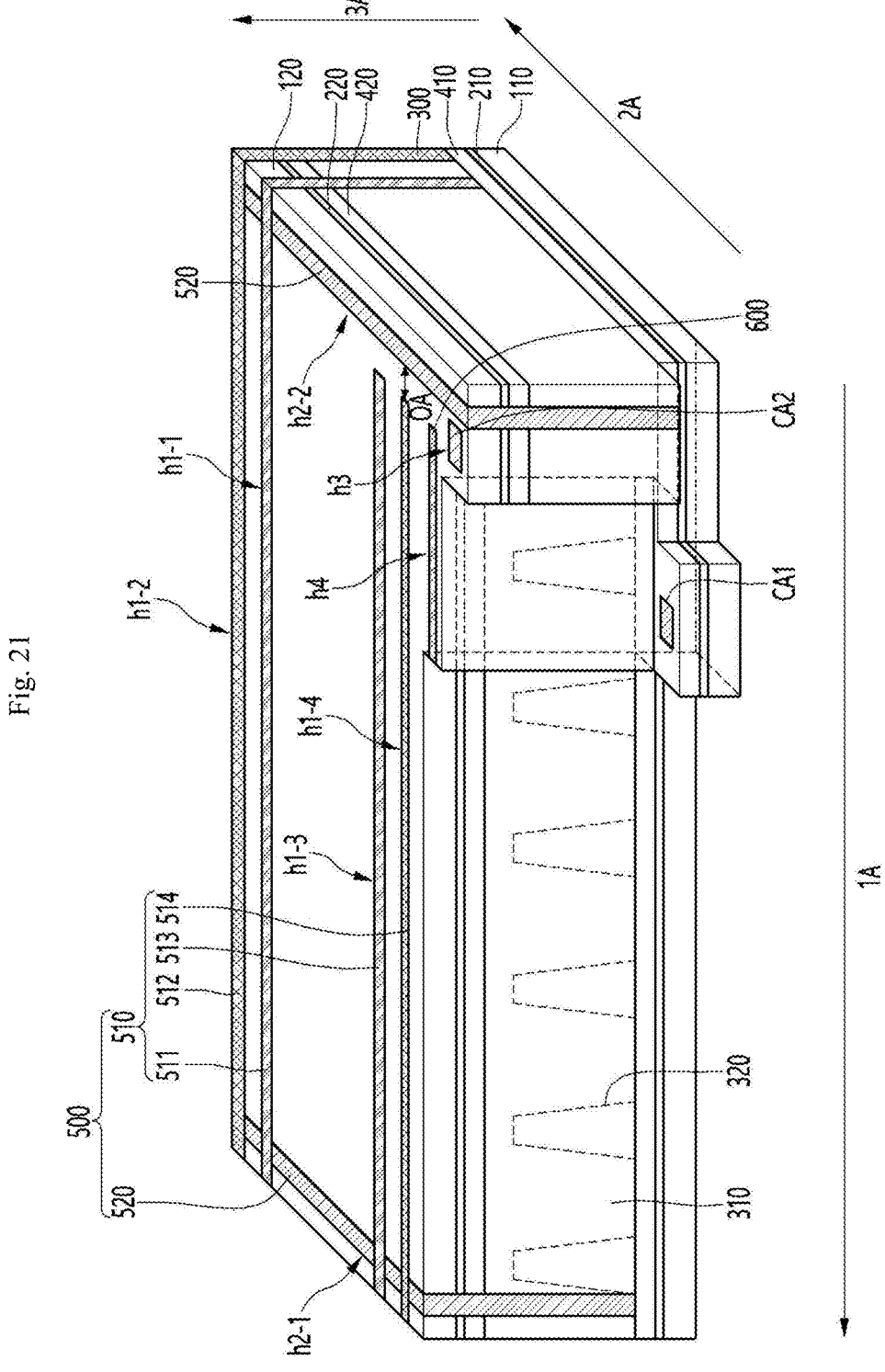
FIG. 21 is a perspective view of an optical path control member according to a fifth embodiment.

FIG. 19 is a perspective view of the optical path control member according to a third embodiment, FIG. 20 is a perspective view of the optical path control member according to a fourth embodiment, and FIG. 21 is a perspective view of the optical path control member according to a fifth embodiment Referring to FIG. 19, in the optical path control member according to the third embodiment, a bridge b may be formed on one of the 1-2 sealing parts and the 1-4 sealing parts.

For example, a plurality of bridges b may be disposed in the 1-2 sealing part 512 disposed in the 1-2 cutting part h1-2 adjacent to the 1-1 cutting part h1-1 defined as the injection par.

The bridge b may be defined as an area in which one surface of the second substrate is exposed as an area in which no cutting part is formed. Accordingly, the 1-2 sealing part 512 may include sub sealing parts spaced apart from each other. That is, the 1-2 sealing part 512 may be defined as an assembly of sub sealing parts spaced apart from each other by the width of the bridge b.

When the first substrate 110 and the second substrate 120 are laminated, they can be easily laminated by the bridge b.

In detail, the bridge is disposed on the 1-2 cutting part disposed on the outermost side among the plurality of cutting parts formed on the second substrate, and thereby the second substrate can be fixed and alignment with the first substrate can be facilitated.

In addition, after the first substrate and the second substrate are bonded, it is possible to inhibit the first substrate and the second substrate from being delaminated due to a too small thickness of the lower portion of the second substrate during a process.

In addition, in a process of injecting the light conversion material after the first substrate and the second substrate are bonded, separation of the 1-2 cutting parts due to pressure from an ink injection device may be inhibited.

That is, since the reduction in strength of the second substrate by the 1-2 cutting parts can be alleviated by the bridge disposed in the 1-2 cutting parts, the manufacturing process can be facilitated, and the reliability of the optical path control member can be improved.

Referring to FIG. 20, in the optical path control member according to the fourth embodiment, the 1-2 sealing parts and the 1-4 sealing parts may be omitted.

That is, after the optical path control member is finally manufactured, the 1-2 sealing part and the 1-4 second sealing part inhibiting the movement of the light conversion material are cut in a final process, so that the optical path control member may include only the 1-1 sealing part.

Accordingly, the size of the bezel area of the optical path control member may be reduced.

Referring to FIG. 21, the optical path control member according to the fifth embodiment may further include a fourth cutting part h4. In detail, the aforementioned dam part 600 may be disposed inside the fourth cutting part h4.

That is, like the sealing part, the dam part 600 may be disposed inside the cutting part formed on the second substrate 120.

Accordingly, the height of the dam part can be increased, and since the dam part is disposed inside the cutting part, the supporting force of the dam part can be increased, and thereby during a process of injecting the light conversion material, overflow of the light conversion material to the outside may be effectively inhibited.

Meanwhile, although FIG. 21 shows the 1-1 sealing part 511, the 1-2 sealing part 512, the 1-3 sealing part 513, and the 1-4 sealing part 514, the embodiment is not limited thereto, and the optical path control member according to the fifth embodiment may omit the 1-2 sealing part 512 and the 1-4 sealing part 514, and may include only the 1-1 sealing part 511 and the 1-3 sealing part 513.

Hereinafter, the optical path control member according to a sixth embodiment will be described with reference to FIGS. 22 and 23.

In the description of the optical path control member according to the sixth embodiment, descriptions of identical or similar elements to those of the optical path control member according to the first to fifth embodiments described above are omitted, and the same reference numerals are assigned to the same components.

Figure 22:
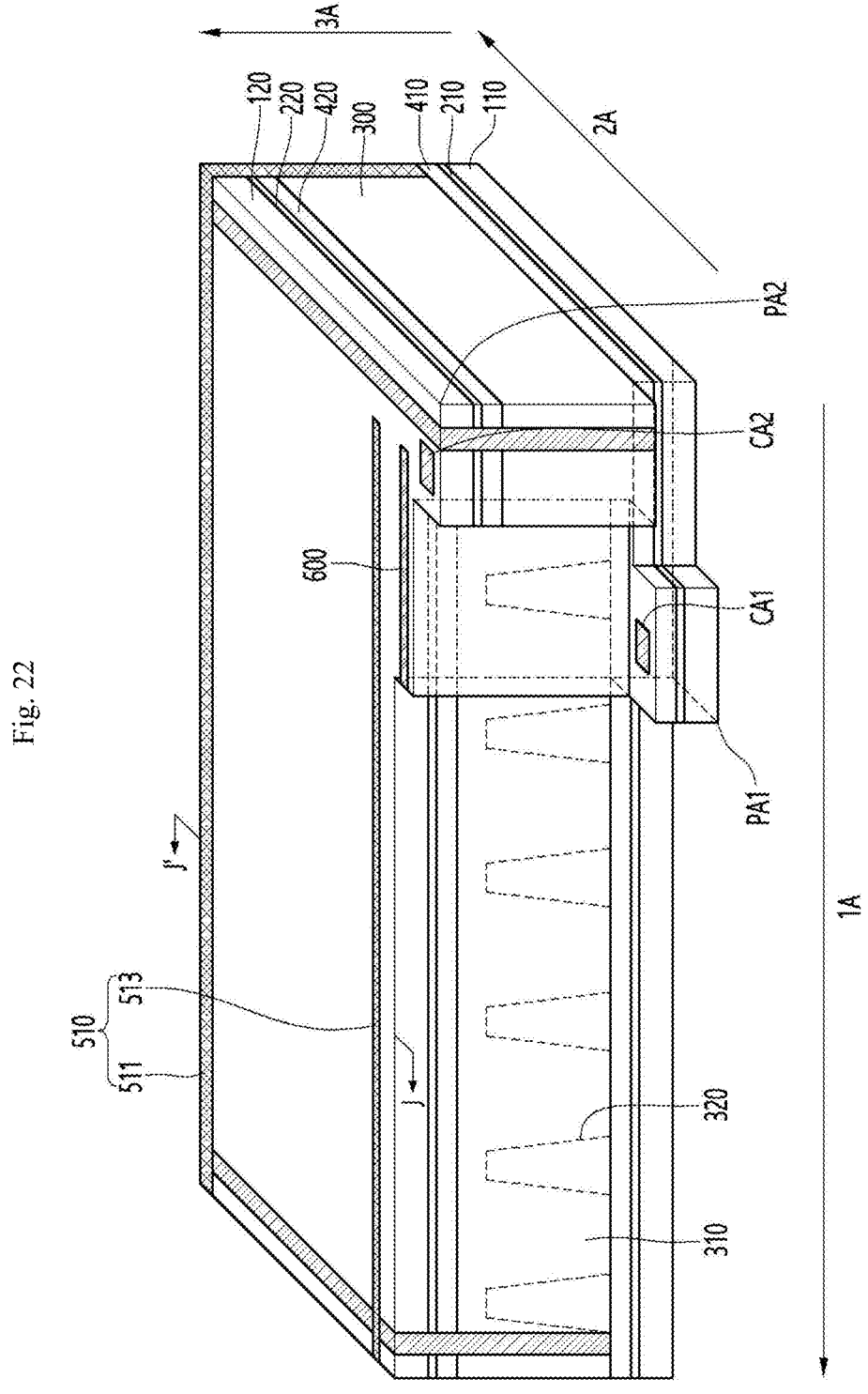
FIG. 22 is a perspective view of an optical path control member according to a sixth embodiment.
Figure 23:
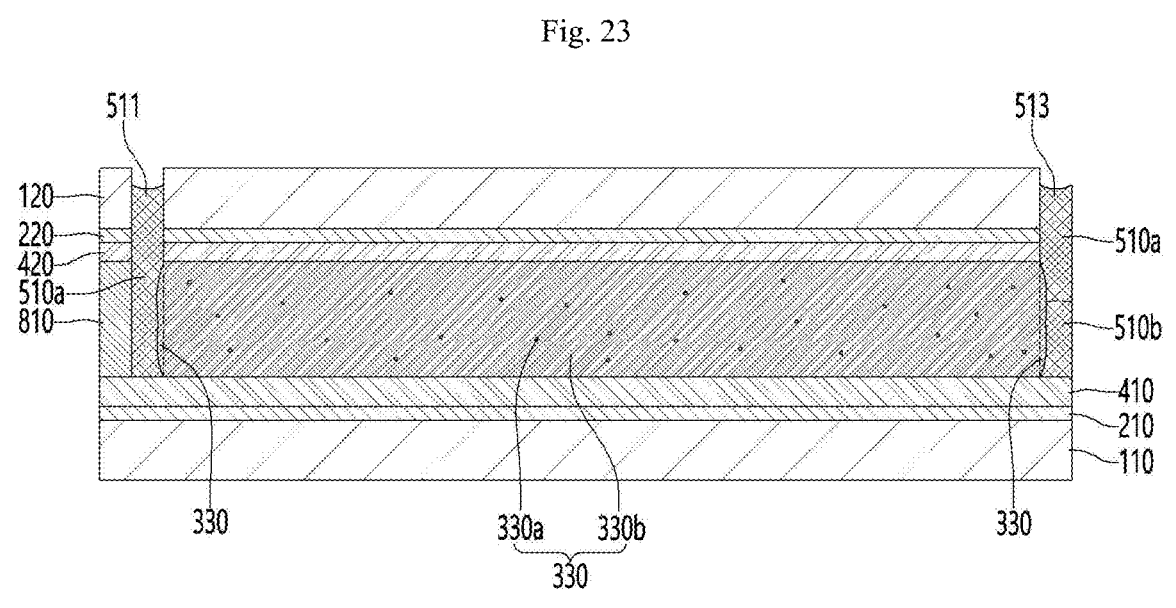

Referring to FIGS. 22 and 23, the optical path control member according to the sixth embodiment may include the first sealing part 510 extending in the first direction of the optical path control member and the second sealing part 520 extending in the second direction of the optical path control member.

The first sealing part 510 may be disposed at both end regions of the optical path control member in the second direction. For example, the first sealing part 510 may include the 1-1 sealing part 511 disposed at one end of the optical path control member in the second direction and the 1-3 sealing part 513 disposed at the other end of the optical path control member in the second direction. That is, the optical path control member according to the sixth embodiment may not include the 1-2 sealing part 512 and the 1-4 sealing part 514 unlike the above-described embodiments. That is, the optical path control member according to the sixth embodiment may include only the 1-1 sealing part 511 and the 1-3 sealing part 513 like the above-described fourth embodiment.

Also, the second sealing part 520 may be disposed at both end regions of the optical path control member in the first direction. For example, the second sealing part 520 may include a 2-1 sealing part 521 disposed at one end of the optical path control member in the first direction and a 2-2 sealing part 522 disposed at the other end of the optical path control member in the second direction.

The first sealing part 510 and the second sealing part 520 may be formed by disposing a sealing material inside a cutting part formed on the second substrate 120.

Also, the optical path control member may include the dam part 600. That is, the optical path control member according to the sixth embodiment may further include a fourth cutting part h4 similarly to the above-described fifth embodiment, and the aforementioned dam may be disposed inside the fourth cutting part h4.

Accordingly, the height of the dam part can be increased, and since the dam part is disposed inside the cutting part, the supporting force of the dam part can be increased, and thereby during a process of injecting the light conversion material, overflow of the light conversion material to the outside may be effectively inhibited.

FIG. 23 is a cross-sectional view taken along the line J-J' of FIG. 22. That is, FIG. 23 is a cross-sectional view taken along the longitudinal direction of one accommodating part among a plurality of accommodating parts.

Referring to FIG. 23, the light conversion material 330 may be disposed inside the accommodating part 320. In addition, the 1-1 sealing part 511 may be disposed at one end of the accommodating part 320, and the 1-3 sealing part 513 may be disposed at the other end.

The 1-1 sealing part 511 and the 1-3 sealing part 513 may be disposed inside the cutting parts formed on the second substrate.

For example, a cutting part formed by sequentially penetrating the second substrate 120, the second electrode 220, the buffer layer 420, the base part 350, and the light conversion unit 300 which is including the barrier rib part is formed on the second substrate, and the first sealing part 510 may be formed by disposing a sealing material inside the cutting part.

Accordingly, the first sealing part 510 may contact the side surface of the second substrate 120. Also, the first sealing part 510 may contact the side surface of the second electrode 220. Also, the first sealing part 510 may contact the side surface of the buffer layer 420. Also, the first sealing part 510 may contact the side surface of the base part 350. Also, the first sealing part 510 may contact a side surface of the partition wall part 310.

The first sealing part 510 is disposed at one end and the other end of the accommodating part, and thereby the light conversion material 330 disposed inside the accommodating part 320 may be sealed.

For example, before forming the 1-1 sealing part 511 and the 1-3 sealing part 513, an inside of the cutting part where the 1-1 sealing part 511 is disposed is defined as the injection part of the accommodating part, and an inside of the cutting part where the 1-3 sealing part 513 are disposed may be defined as an exit part of the accommodating part. Subsequently, the light conversion material 330 may be disposed inside the accommodating part by injecting the light conversion material through the injection part and vacuum suctioning the light conversion material through the exit part.

Subsequently, one end and the other end of the accommodating part 320 are sealed by forming the 1-1 sealing part 511 and the 1-3 sealing part 513 at the injection part and the exit part, and thereby the light conversion material 330 inside the accommodating part 320 may be sealed inside the accommodating part 320.

At this time, a light conversion material remaining after the injection process may exist in the injection part and the exit part, and thereby at least one of the 1-1 sealing part 511 and the 1-3 sealing part 513 may include a light conversion material together with a sealing material. That is, at least one of the 1-1 sealing part 511 and the 1-3 sealing part 513 is formed by mixing the sealing material and the light conversion material, or may include the sealing material and the light conversion material in a phase-separated state That is, as shown in FIG. 23, after injecting the light conversion material 330 into the accommodating part 320, before filling the sealing material for sealing the light conversion material 330, some of the light conversion material may remain in the injection part and the exit part.

In this case, when forming the sealing material in the injection part and the exit part, the light conversion material remaining in the injection part and the outlet part and the sealing material may be mixed, and thereby the light conversion material may be partly mixed in at least one of the 1-1 sealing part 511 and the 1-3 sealing part 513 formed by curing the sealing material.

Accordingly, at least one of the 1-1 sealing part 511 and the 1-3 sealing part 513 may include the sealing material 510a and a light conversion material 330. For example, at least one sealing part of the 1-1 sealing part 511 and the 1-3 sealing part 513 may include the sealing material 510a and the light conversion material 330 that are not mixed and separated, or may include the sealing material 510a, the light conversion material 330, and a mixed material 510b in which the sealing material 510a and the light conversion material 330 are mixed.

In this case, at least one of the 1-1 sealing part 511 and the 1-3 sealing part 513 may contain more sealing material than the light conversion material. In detail, the light conversion material may be included in an amount of 10% or less with respect to the total material that is the sum of the light conversion material and the sealing material. In detail, the light conversion material may be included in an amount of 0.01% to 10% with respect to the total material. In more detail, the light conversion material may be included in an amount of 1% to 8% with respect to the total material. In more detail, the light conversion material may be included in an amount of 3% to 5% with respect to the total material.

When the light conversion material is included in an amount of more than 10% with respect to the entire material of the sealing part, the curing characteristics of the sealing part are reduced, and thereby the sealing properties of the first sealing part and the second sealing part sealing the accommodating may be reduced. Accordingly, external impurities may flow into the accommodating part or the light conversion material inside the accommodating part may leak to the outside, and thereby reliability of the optical path control member may be reduced.

In addition, when the amount of the light conversion material is less than 0.01% of the total material of the sealing part, the sealing part may not have any light conversion characteristics, and thereby the light conversion area of the optical path control member may be reduced.

That is, in the optical path control member according to the first embodiment, since the sealing part contains 0.01% or more of the light conversion material forming the light conversion characteristics with respect to the entire material of the sealing part, the transmission mode and the light blocking mode may be implemented by applying a voltage to all or a partial area where the first sealing part is disposed. Accordingly, since a partial area of the first sealing part area defined as the bezel area in the optical path control member can be used as an effective area having light conversion characteristics as needed, the optical path control member can be driven in various modes in various environments and uses.

Hereinafter, the optical path control member according to a seventh embodiment will be described with reference to FIGS. 24 to 26.

In the description of the optical path control member according to the seventh embodiment, descriptions of identical or similar elements to those of the optical path control member according to the first to sixth embodiments described above are omitted, and the same reference numerals are assigned to the same components.

Figure 24:
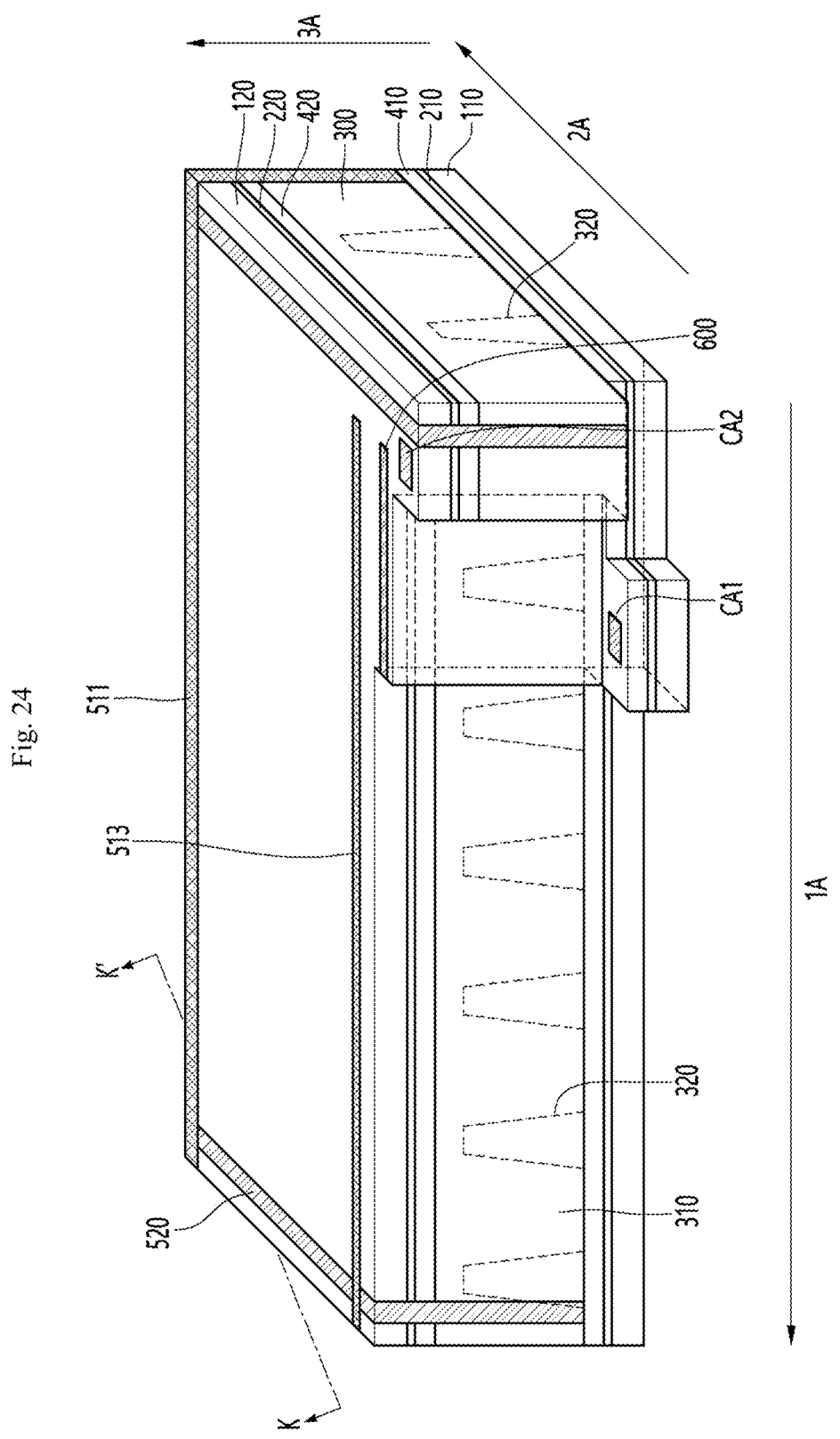
FIG. 24 is a perspective view of an optical path control member according to a seventh embodiment.
Figure 25:
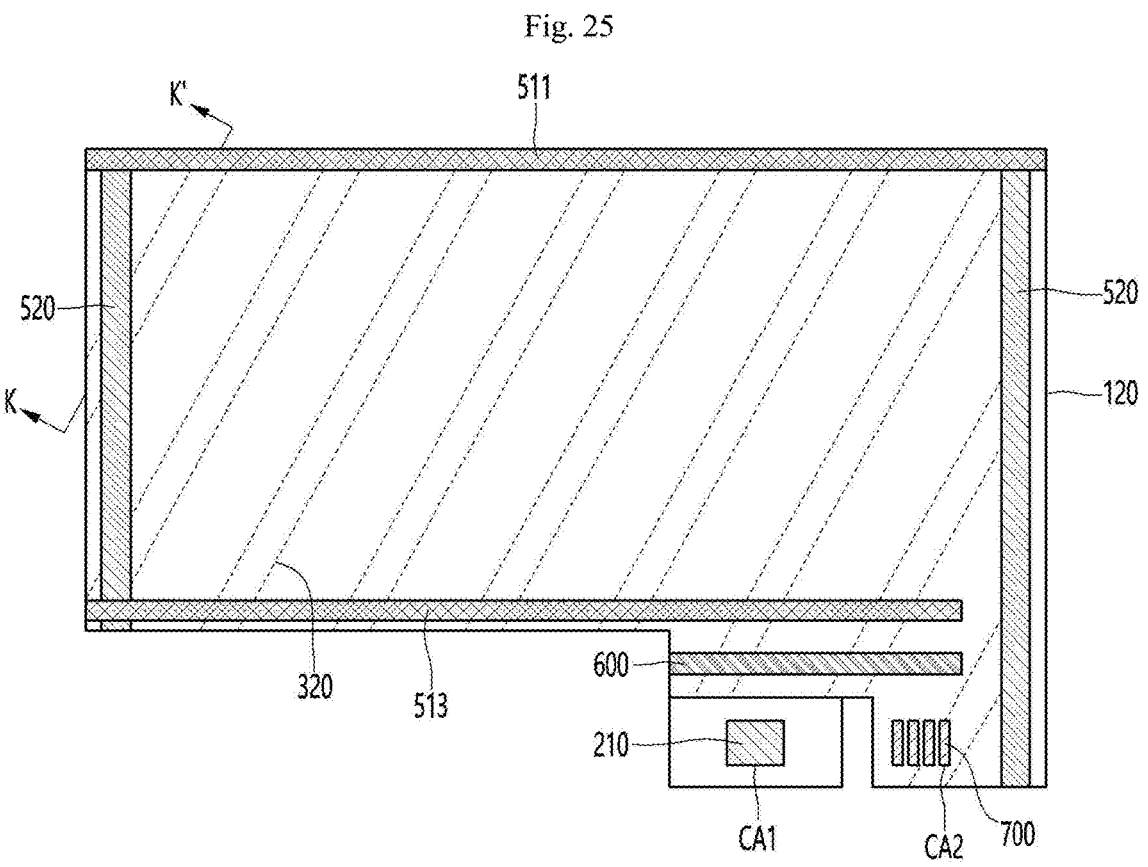
FIG. 25 is a top view of the second substrate in which the first substrate and the second substrate of the optical path control member according to the seventh embodiment are laminated.

Referring to FIGS. 24 and 25, in the optical path control member according to the seventh embodiment, unlike the previously described sixth embodiment, the accommodating part 320 of the light conversion unit may be tilted at a certain angle.

Referring to FIGS. 24 and 25, the accommodating part 320 may extend in a direction different from the first direction 1A and the second direction 2A.

Accordingly, one end and the other end of at least one of the accommodating parts 320 may contact the first sealing part 510, and one end and the other end of the at least one accommodating part may contact the first sealing part 510 and the second sealing part 520.

When the optical path control member is combined with a display panel to form a display device, since the accommodating part is tilted and disposed at a predetermined inclination angle, a moire phenomenon caused by overlapping the accommodating part of the optical path control member and the pattern part of the display panel may be inhibited.

That is, one end and the other end of the accommodating part 320 according to the seventh embodiment may be formed on both the outer surface in the first direction and the outer surface in the second direction of the optical path control member.

Figure 26:
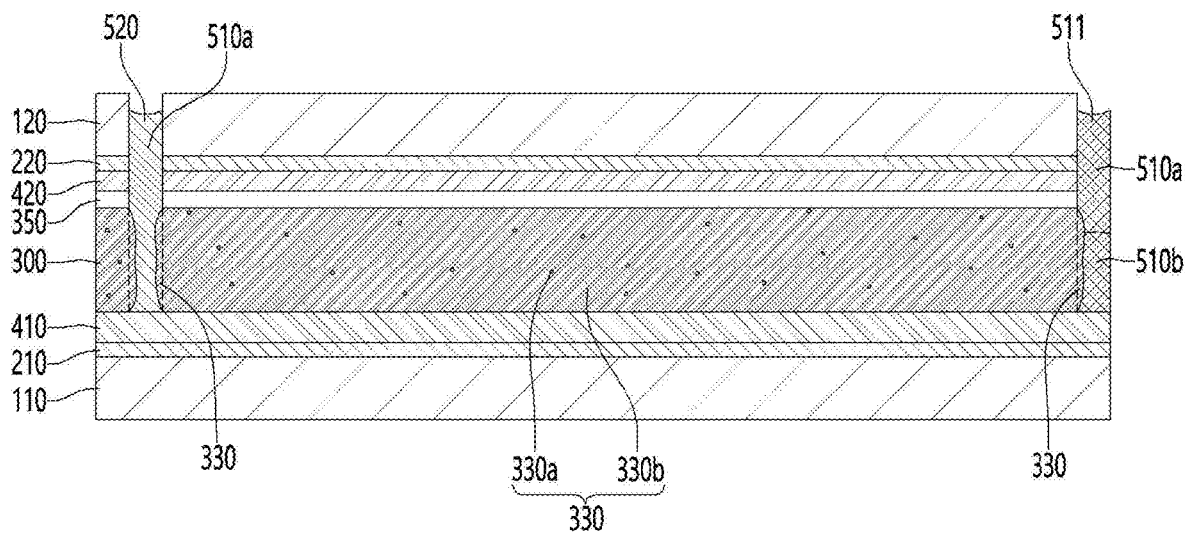
FIG. 26 is a cross-sectional view taken along the line K-K' of FIG. 25

FIG. 26 is a cross-sectional view taken along the line K-K' of FIGS. 24 and 25.

Referring to FIG. 18, the light conversion material 330 may be disposed inside the accommodating part 320. In detail, the light conversion material 330, the 1-1 sealing part 511, the 1-2 sealing part 512, the 1-3 sealing part 513, and a 1-4 sealing part 514 may be disposed inside the accommodating part 320.

Referring to FIG. 26, the light conversion material 330 may be disposed inside the accommodating part 320. In addition, the first sealing part 510 may be disposed at one end of the accommodating part 320, and the second sealing part 520 may be disposed at the other end.

At least one of the first sealing part 510 and the second sealing part 520 may include a light conversion material together with a sealing material. That is, at least one of the first sealing part 510 and the second sealing part 520 is formed by mixing the sealing material and the light conversion material, or may include the sealing material and the light conversion material in a phase-separated state That is, as shown in FIG. 26, after injecting the light conversion material 330 into the accommodating part 320, before filling the sealing material for sealing the light conversion material 330, some of the light conversion material may remain in the injection part and the exit part.

In this case, when forming the sealing material in the injection part and the exit part, the light conversion material remaining in the injection part and the outlet part and the sealing material may be mixed, and thereby the light conversion material may be partly mixed in the 1-1 sealing part 511 formed by curing the sealing material.

In addition, a portion of the light conversion material also moves in the direction of the second sealing part in an area adjacent to the second sealing part 520, and thereby the light conversion material may be partly mixed in the second sealing part 520 formed by curing the sealing material Accordingly, at least one of the first sealing part 510 and the second sealing part 520 may include the sealing material 510*a* and a light conversion material 330. For example, at least one sealing part of the first sealing part 510 and the second sealing part 520 may include the sealing material 510*a* and the light conversion material 330 that are not mixed and separated, or may include the sealing material 510*a*, the light conversion material 330, and a mixed material 510*b* in which the sealing material 510*a* and the light conversion material 330 are mixed.

In this case, at least one of the first sealing part 510 and the second sealing part 520 may contain more sealing material than the light conversion material. In detail, the light conversion material may be included in an amount of 10% or less with respect to the total material that is the sum of the light conversion material and the sealing material. In detail, the light conversion material may be included in an amount of 0.01% to 10% with respect to the total material. In more detail, the light conversion material may be included in an amount of 1% to 8% with respect to the total material. In more detail, the light conversion material may be included in an amount of 3% to 5% with respect to the total material.

When the light conversion material is included in an amount of more than 10% with respect to the entire material of the sealing part, the curing characteristics of the sealing part are reduced, and thereby the sealing properties of the first sealing part and the second sealing part sealing the accommodating may be reduced. Accordingly, external impurities may flow into the accommodating part or the light conversion material inside the accommodating part may leak to the outside, and thereby reliability of the optical path control member may be reduced.

In addition, when the amount of the light conversion material is less than 0.01% of the total material of the sealing part, the sealing part may not have any light conversion characteristics, and thereby the light conversion area of the optical path control member may be reduced.

That is, in the optical path control member according to the seventh embodiment, since the sealing part contains 0.01% or more of the light conversion material forming the light conversion characteristics with respect to the entire material of the sealing part, the transmission mode and the light blocking mode may be implemented by applying a voltage to all or a partial area where the first and/or second sealing part is disposed. Accordingly, since a partial area of the first and/or second sealing part area defined as the bezel area in the optical path control member can be used as an effective area having light conversion characteristics as needed, the optical path control member can be driven in various modes in various environments and uses.

Hereinafter, referring to FIGS. 27 to 31, a display device to which an optical path control member according to an embodiment is applied will be described.

Figure 27:
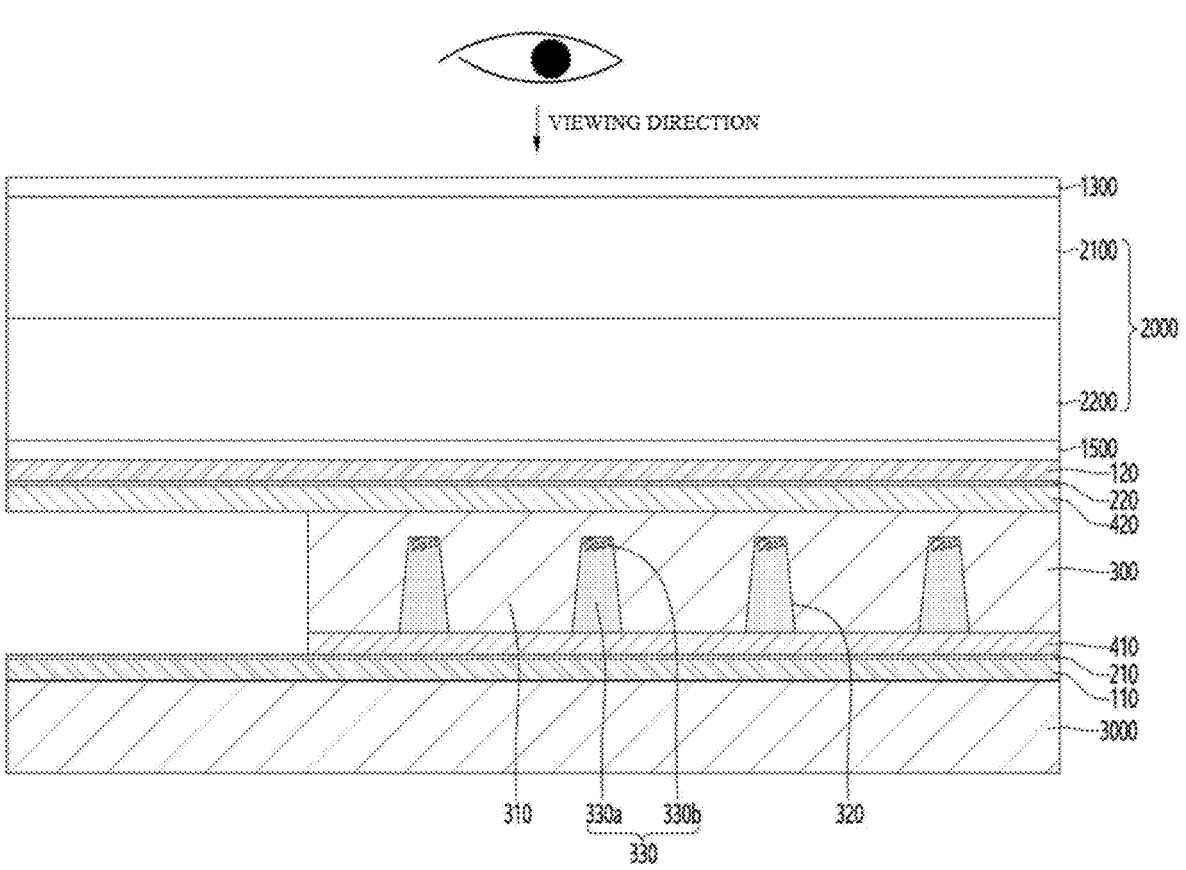
FIGS. 27 and 28 are cross-sectional views of a display device to which an optical path control member according to an embodiment is applied.
Figure 28:
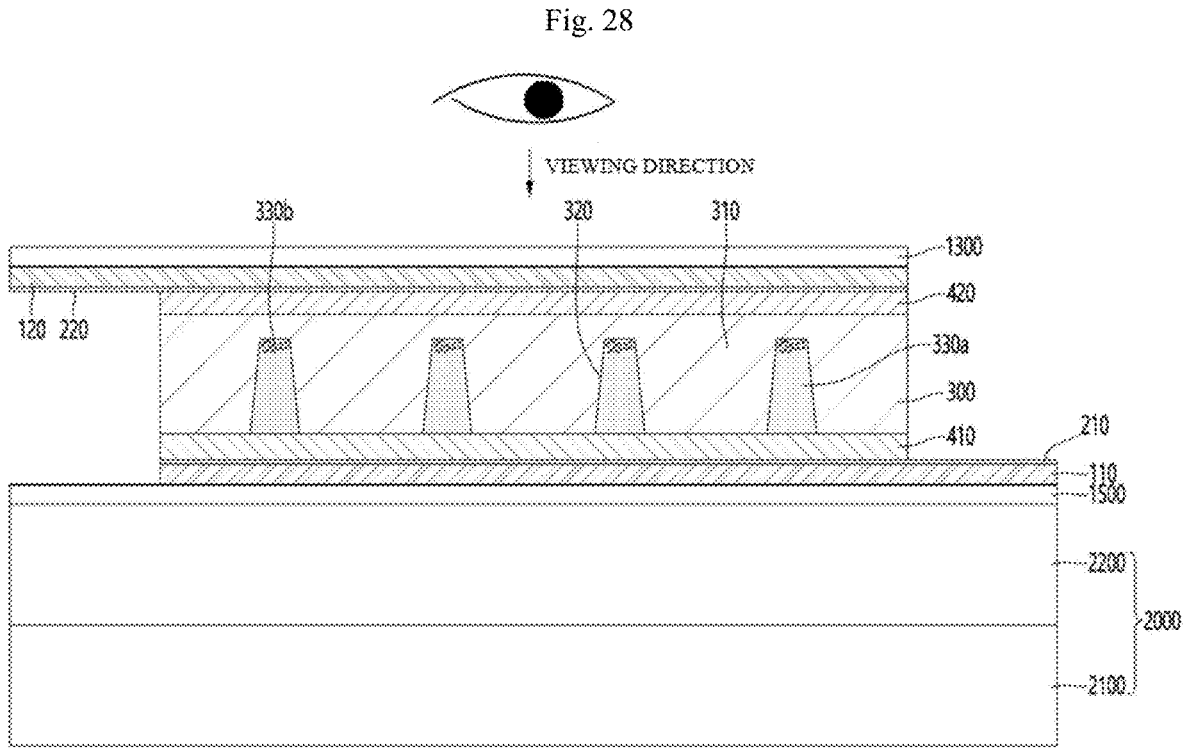

Referring to FIGS. 27 to 28, an optical path control member 1000 according to an embodiment may be disposed on or under a display panel 2000.

The display panel 2000 and the optical path control member 1000 may be disposed to be adhered to each other. For example, the display panel 2000 and the optical path control member 1000 may be adhered to each other via an adhesive layer 1500. The adhesive layer 1500 may be transparent. For example, the adhesive layer 1500 may include an adhesive or an adhesive layer including an optical transparent adhesive material.

The adhesive layer 1500 may include a release film. In detail, when adhering the optical path control member and the display panel, the optical path control member and the display panel may be adhered after the release film is removed.

The display panel 2000 may include a first' substrate 2100 and a second' substrate 2200. When the display panel 2000 is a liquid crystal display panel, the optical path control member may be formed under the liquid crystal panel. That is, when a surface viewed by the user in the liquid crystal panel is defined as an upper portion of the liquid crystal panel, the optical path control member may be disposed under the liquid crystal panel. The display panel 2000 may be formed in a structure in which the first' substrate 2100 including a thin film transistor (TFT) and a pixel electrode and the second' substrate 2200 including color filter layers are bonded to each other with a liquid crystal layer interposed therebetween.

In addition, the display panel 2000 may be a liquid crystal display panel of a color filter on transistor (COT) structure in which a thin film transistor, a color filter, and a black electrolyte are formed at the first' substrate 2100 and the second' substrate 2200 is bonded to the first' substrate 2100 with the liquid crystal layer interposed therebetween. That is, a thin film transistor may be formed on the first' substrate 2100, a protective film may be formed on the thin film transistor, and a color filter layer may be formed on the protective film. In addition, a pixel electrode in contact with the thin film transistor may be formed on the first' substrate 2100. At this point, in order to improve an aperture ratio and simplify a masking process, the black electrolyte may be omitted, and a common electrode may be formed to function as the black electrolyte.

In addition, when the display panel 2000 is the liquid crystal display panel, the display device may further include a backlight unit 3000 providing light from a rear surface of the display panel 2000.

That is, as shown in FIG. 27, the optical path control member may be disposed under the liquid crystal panel and on the backlight unit 3000, and the optical path control member may be disposed between the backlight unit 3000 and the display panel 2000.

Alternatively, as shown in FIG. 28, when the display panel 2000 is an organic light emitting diode panel, the optical path control member may be formed on the organic light emitting diode panel. That is, when the surface viewed by the user in the organic light emitting diode panel is defined as an upper portion of the organic light emitting diode panel, the optical path control member may be disposed on the organic light emitting diode panel. The display panel 2000 may include a self-luminous element that does not require a separate light source. In the display panel 2000, a thin film transistor may be formed on the first' substrate 2100, and an organic light emitting element in contact with the thin film transistor may be formed. The organic light emitting element may include an anode, a cathode, and an organic light emitting layer formed between the anode and the cathode. In addition, the second' substrate 2200 configured to function as an encapsulation substrate for encapsulation may be further included on the organic light emitting element.

In addition, although not shown in drawings, a polarizing plate may be further disposed between the optical path control member 1000 and the display panel 2000. The polarizing plate may be a linear polarizing plate or an external light reflection preventive polarizing plate. For example, when the display panel 2000 is a liquid crystal display panel, the polarizing plate may be the linear polarizing plate. Further, when the display panel 2000 is the organic light emitting diode panel, the polarizing plate may be the external light reflection inhibiting polarizing plate.

In addition, an additional functional layer 1300 such as an anti-reflection layer, an anti-glare, or the like may be further disposed on the optical path control member 1000. Specifically, the functional layer 1300 may be adhered to one surface of the first substrate 110 of the optical path control member. Although not shown in drawings, the functional layer 1300 may be adhered to the first substrate 110 of the optical path control member via an adhesive layer. In addition, a release film for protecting the functional layer may be further disposed on the functional layer 1300.

Further, a touch panel may be further disposed between the display panel and the optical path control member.

It is illustrated in the drawings that the optical path control member is disposed at an upper portion of the display panel, but the embodiment is not limited thereto, and the optical path control member may be disposed at various positions such as a position in which light is adjustable, that is, a lower portion of the display panel, or between a second substrate and a first substrate of the display panel, or the like.

In addition, it is shown in the drawings that the optical conversion unit of the optical path control member according to the embodiment is in a direction parallel or perpendicular to an outer surface of the second substrate, but the optical conversion unit is formed to be inclined at a predetermined angle from the outer surface of the second substrate. Through this, a moire phenomenon occurring between the display panel and the optical path control member may be reduced.

Figure 29:
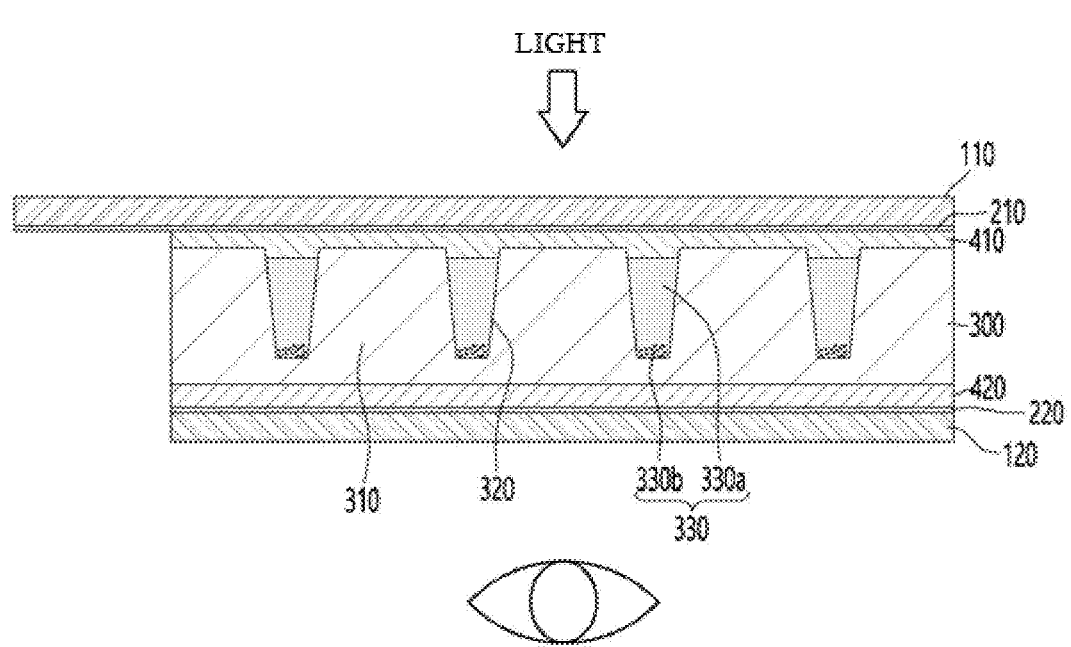
FIGS. 29 to 31 are views for describing one embodiment of the display device to which the optical path control member according to the embodiment is applied.
Figure 29:
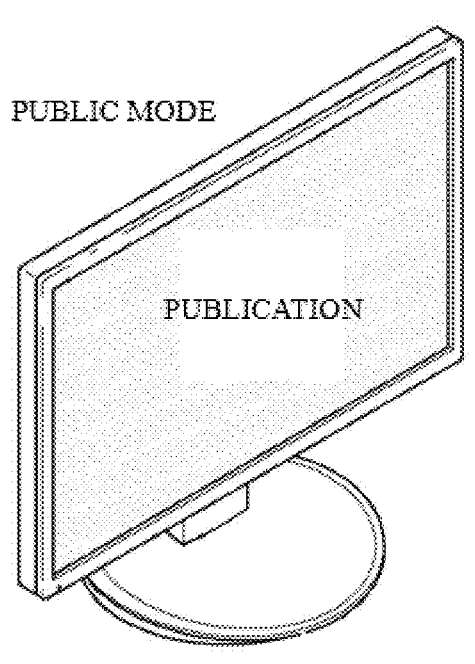
Figure 30:
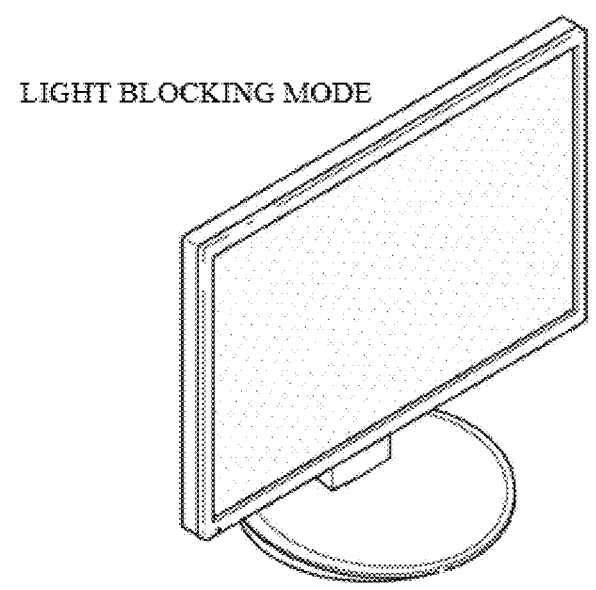
Figure 31:
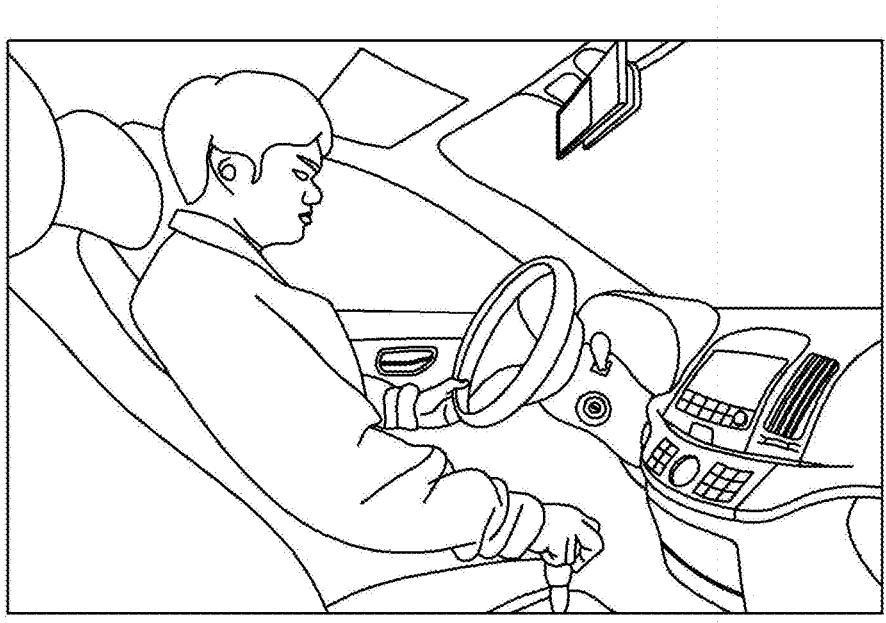

Referring to FIGS. 29 to 31, an optical path control member according to an embodiment may be applied to various display devices.

Referring to FIGS. 29 to 31, the optical path control member according to the embodiment may be applied to a display device that displays a display.

For example, when power is applied to the optical path control member as shown in FIG. 29, the accommodating portion functions as the light transmitting part, so that the display device may be driven in the public mode, and when power is not applied to the optical path control member as shown in FIG. 30, the accommodating portion functions as the light blocking part, so that the display device may be driven in the light blocking mode.

Accordingly, a user may easily drive the display device in a privacy mode or a normal mode according to application of power.

Light emitted from the backlight unit or the self-luminous element may move from the first substrate toward the second substrate. Alternatively, the light emitted from the backlight unit or the self-luminous element may also move from the second substrate toward the first substrate.

In addition, referring to FIG. 31, the display device to which the optical path control member according to the embodiment is applied may also be applied inside a vehicle.

For example, the display device including the optical path control member according to the embodiment may display a video confirming information of the vehicle and a movement route of the vehicle. The display device may be disposed between a driver seat and a passenger seat of the vehicle.

In addition, the optical path control member according to the embodiment may be applied to a dashboard that displays a speed, an engine, an alarm signal, and the like of the vehicle.

Further, the optical path control member according to the embodiment may be applied to a front glass (FG) of the vehicle or right and left window glasses.

The characteristics, structures, effects, and the like described in the above-described embodiments are included in at least one embodiment of the present invention, but are not limited to only one embodiment. Furthermore, the characteristic, structure, and effect illustrated in each embodiment may be combined or modified for other embodiments by a person skilled in the art. Accordingly, it is to be understood that such combination and modification are included in the scope of the present invention.

In addition, embodiments are mostly described above, but the embodiments are merely examples and do not limit the present invention, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present invention defined in the following claims.

The invention claimed is:

1. An optical path control member comprising:
a first substrate on which a first direction and a second direction are defined;
a first electrode disposed on the first substrate;
a second substrate disposed on the first substrate and defining the first direction and the second direction;
a second electrode disposed under the second substrate; and
a light conversion unit disposed between the first electrode and the second electrode,
wherein the second substrate and the second electrode are provided with a cutting part penetrating the second substrate and the second electrode,
wherein the cutting part comprises;
a 1-1 cutting part and a 1-3 cutting part disposed facing each other in the second direction;
a 1-2 cutting part adjacent to the 1-1 cutting part and spaced apart from the 1-1 cutting part; and
a 1-4 cutting part adjacent to the 1-3 cutting part and spaced apart from the 1-3 cutting part,
wherein a 1-1 sealing part and a 1-3 sealing part are respectively disposed on the 1-1 cutting part and the 1-3 cutting part,
wherein a 1-2 sealing part and a 1-4 sealing part are disposed inside the 1-2 cutting part and the 1-4 cutting part, respectively, and
wherein the cutting parts 1-1 through 1-4 all are positioned lengthwise in the first direction, the 1-1 cutting part is positioned more inward than the 1-2 cutting part, and the 1-3 cutting part is positioned more inward than the 1-4 cutting part.

2. The optical path control member of claim 1, comprising a buffer layer disposed between the second electrode and the light conversion unit,
wherein the light conversion unit includes a plurality of barrier rib parts, a plurality of accommodating parts, and a base part, and
wherein at least one of the 1-1 cutting part, the 1-2 cutting part, the 1-3 cutting part, and the 1-4 cutting part penetrates the buffer layer and the base part.

3. The optical path control member of claim 2, comprising an adhesive layer disposed between the first electrode and the light conversion unit, wherein at least one of the 1-1 sealing part, the 1-2 sealing part, the 1-3 sealing part, and the 1-4 sealing part is disposed in direct contact with the adhesive layer.

4. The optical path control member of claim 1, wherein the light conversion unit includes a plurality of accommodating parts and a plurality of barrier rib parts, and
wherein the 1-1 sealing part and the 1-3 sealing part are disposed at one end and an other end of the accommodating part, respectively.

5. The optical path control member of claim 4, wherein at least one of the 1-1 sealing part, the 1-2 sealing part, the 1-3 sealing part, and the 1-4 sealing part includes a bridge exposing one surface of the second substrate.

6. The optical path control member of claim 5, wherein a plurality of bridges are disposed in the 1-2 sealing part.

7. The optical path control member of claim 5, wherein the 1-2 sealing part includes a plurality of sub sealing parts spaced apart from each other.

8. The optical path control member of claim 4, wherein a dam part disposed in contact with the 1-4 sealing part is disposed in the accommodating part.

9. The optical path control member of claim 4, wherein an open area is formed on the second substrate.

10. The optical path control member of claim 9, wherein the open area is formed in a region between the 1-3 cutting part and a 2-2 cutting part and in a region between the 1-4 cutting pars and the 2-2 cutting part.

11. The optical path control member of claim 9, wherein current is transmitted toward the accommodating part through the second electrode by the open area.

12. The optical path control member of claim 1, wherein a light conversion material is disposed between the 1-1 sealing part and the 1-2 sealing part or between the 1-3 sealing part and the 1-4 sealing part.

13. A display device comprising:
a panel including at least one of a display panel and a touch panel; and
the optical path control member of claim 1, which is disposed on or under the panel.

14. The display device of claim 13, wherein the panel includes a backlight unit and a liquid crystal display panel,
wherein the optical path control member is disposed between the backlight unit and the liquid crystal display panel, and
wherein a light emitted from the backlight unit moves in a direction from the first substrate toward the second substrate.

15. The display device of claim 13, wherein the panel includes an organic light emitting diode panel,
wherein the optical path control member is disposed on the organic light emitting diode panel, and
wherein a light emitted from the panel moves in a direction from the first substrate toward the second substrate.

* * * * *